United States Patent
Ueda et al.

(10) Patent No.: US 6,468,676 B1
(45) Date of Patent: Oct. 22, 2002

(54) ORGANIC ELECTROLUMINESCENT DISPLAY ELEMENT, FINDER SCREEN DISPLAY DEVICE, FINDER AND OPTICAL DEVICE

(75) Inventors: Hideaki Ueda, Kishiwada; Akihito Hisamitsu; Takeshi Kitahora, both of Amagasaki; Yoshihisa Terasaka; Keiichi Furukawa, both of Suita, all of (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/495,299

(22) Filed: Feb. 1, 2000

(30) Foreign Application Priority Data

| Jan. 2, 1999 | (JP) | ............................................. 11-023605 |
| Jan. 2, 1999 | (JP) | ............................................. 11-023606 |
| Jan. 2, 1999 | (JP) | ............................................. 11-023607 |

(51) Int. Cl.$^7$ ............................................... H05B 33/14
(52) U.S. Cl. ........................ 428/690; 428/704; 428/213; 428/209; 313/504; 313/505; 257/40; 257/103
(58) Field of Search .............................. 428/690, 917, 428/704, 213, 209; 313/504, 505; 257/40, 103

(56) References Cited

U.S. PATENT DOCUMENTS

| 4,885,211 A | * | 12/1989 | Tang et al. ................. 428/457 |
| 5,457,565 A | | 10/1995 | Namiki et al. ............... 359/273 |
| 5,652,930 A | | 7/1997 | Teremy et al. ............... 396/287 |
| 5,776,623 A | * | 7/1998 | Hung et al. .................. 428/690 |
| 5,837,391 A | * | 11/1998 | Utsugi ........................ 428/690 |
| 5,858,563 A | * | 1/1999 | Sano et al. .................. 428/690 |

FOREIGN PATENT DOCUMENTS

| JP | 6-163158 | 6/1994 |
| JP | 8-220618 | 8/1996 |
| JP | 9-199276 | 7/1997 |
| JP | 10-162959 | 6/1998 |

* cited by examiner

Primary Examiner—Cynthia H. Kelly
Assistant Examiner—Ling Xu
(74) Attorney, Agent, or Firm—Morrison & Foerster LLP

(57) ABSTRACT

An organic electroluminescent display element has at least a positive electrode, an organic luminescent film, an electron injection layer and a negative electrode. Each of the positive and negative electrodes is formed of a transparent conductive film, the electron injection layer is formed of a thin transparent film made of a halogenide of an alkali metal or an alkaline earth metal, or an organic metal complex containing an alkali metal or an alkaline earth metal as a metal, and the organic metal complex is at least one complex selected from the group consisting of acetylacetonate complexes, α-nitroso-β-naphthol complexes, salicylaldoxime complexes, cupferron complexes, benzoinoxime complexes, bipyridine complexes, phenanthroline complexes, crown complexes, proline complexes and benzoylacetone complexes.

13 Claims, 25 Drawing Sheets

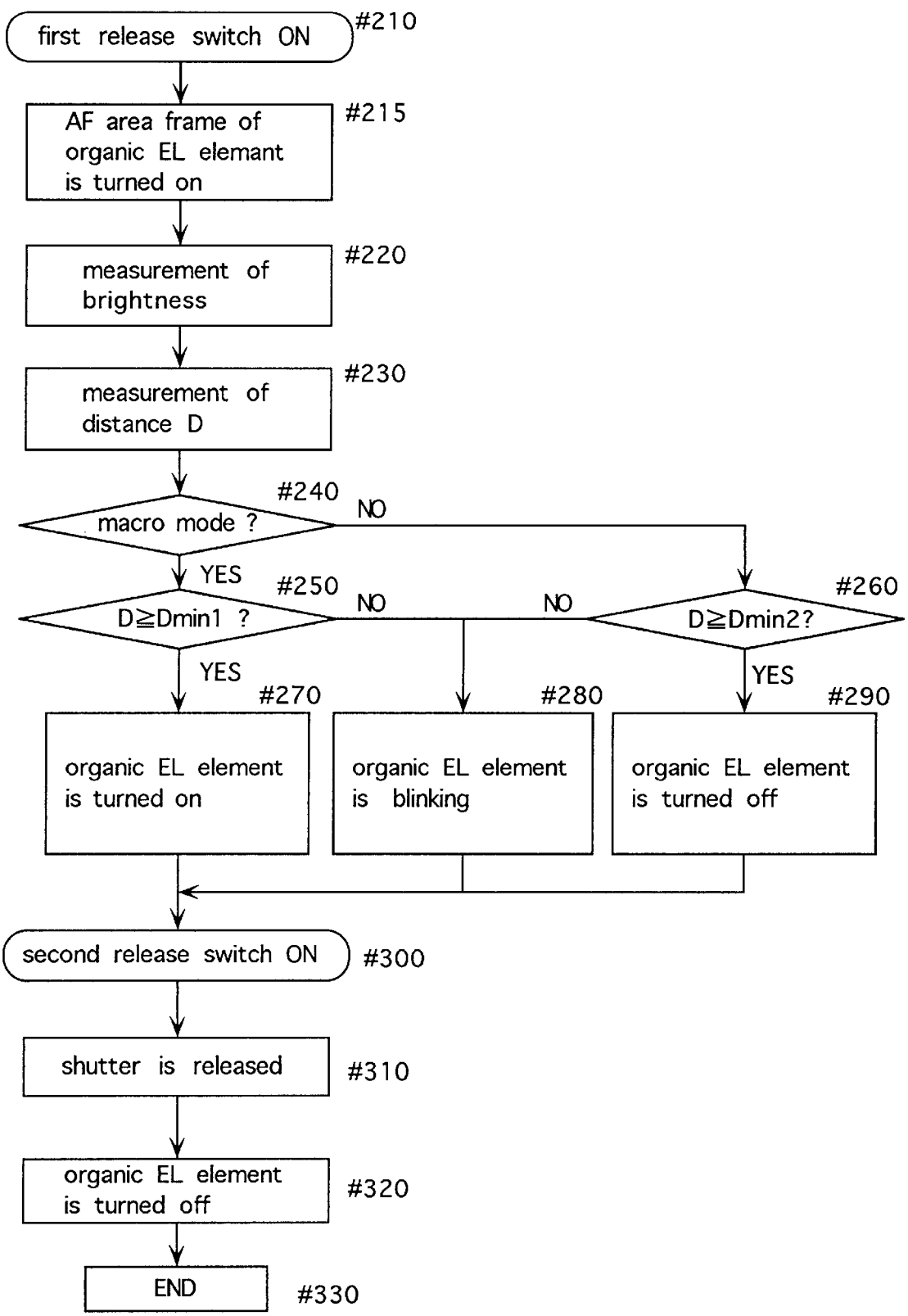

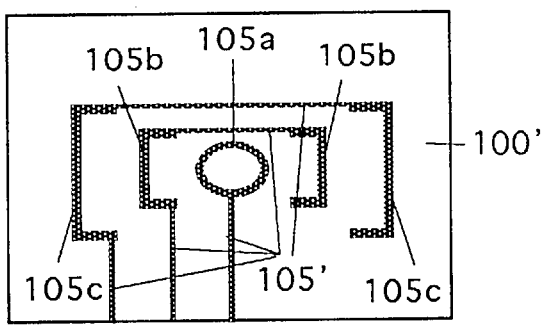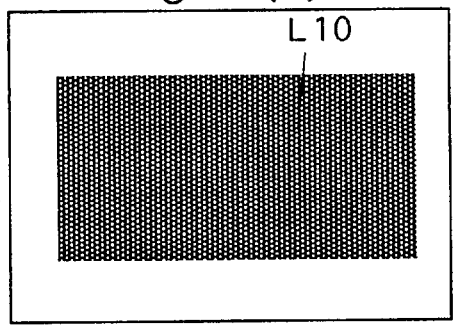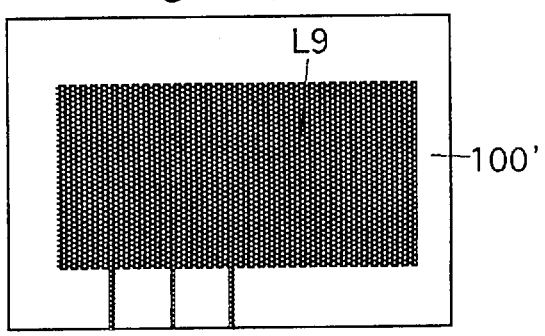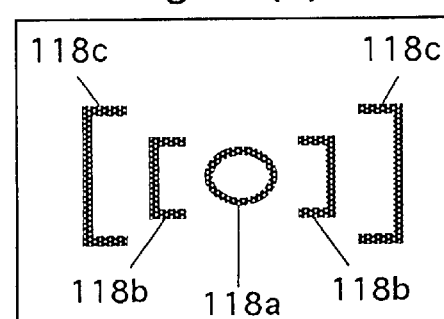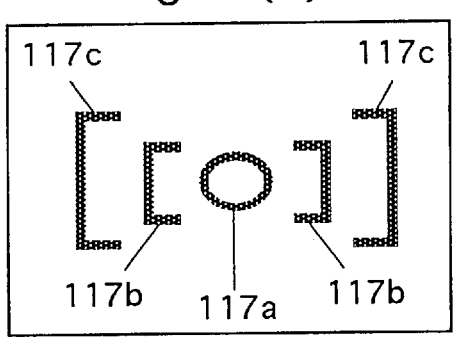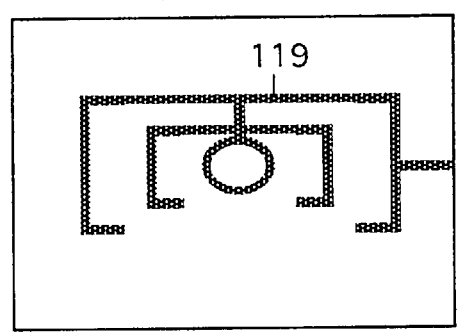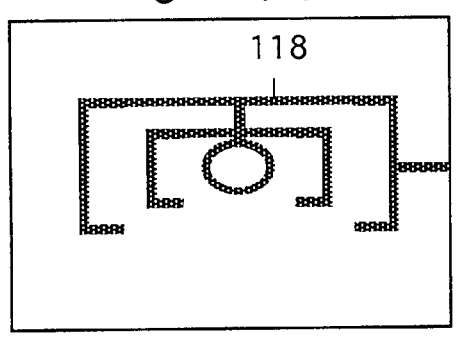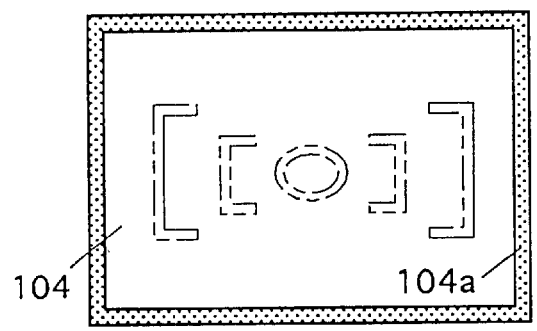

Fig.30(A)
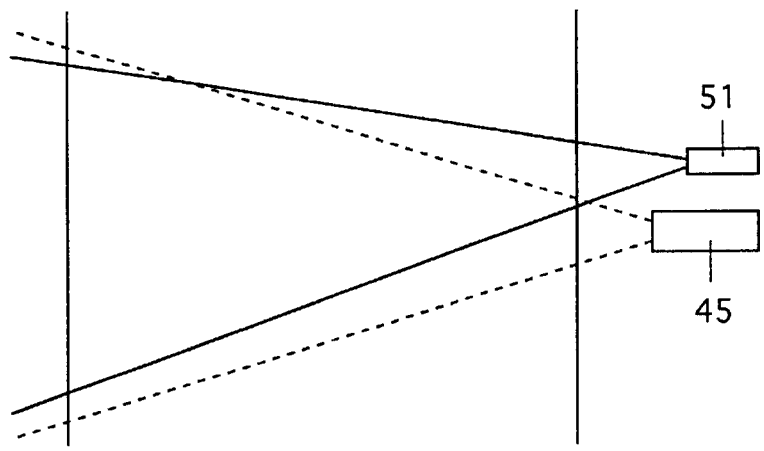
Fig.30(B)
middle or long range
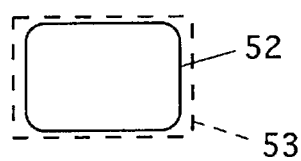
Fig.30(C)
short range
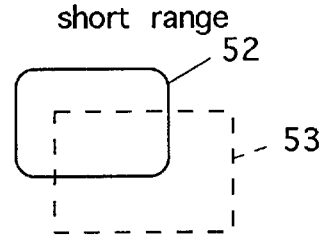
Fig.31(PriorArt)
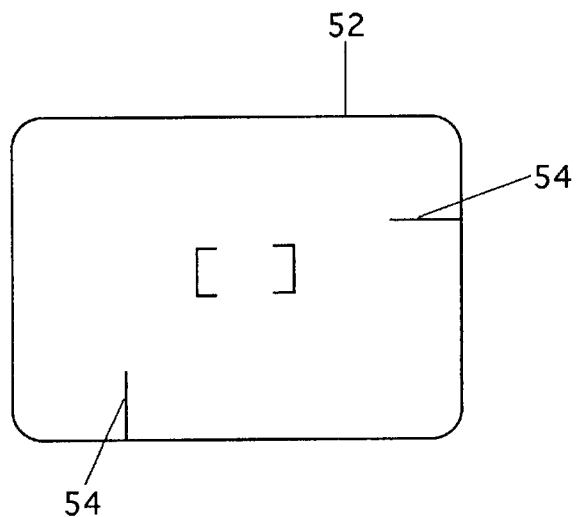

ORGANIC ELECTROLUMINESCENT DISPLAY ELEMENT, FINDER SCREEN DISPLAY DEVICE, FINDER AND OPTICAL DEVICE

The invention is based on patent application Nos. H11-23605 (23605/1999) Pat., H11-23606 (23606/1999) Pat. and H11-23607 (23607/1999) Pat. filed in Japan, the contents of which are hereby incorporated by reference.

BACKGROUND OF THE INVENTION

1. Field of the Invention

The present invention relates to an organic electro-luminescence display element including a pair of electrodes and a film (organic electro-luminescence film), located between the electrodes, made of an organic compound and having an organic luminescent layer.

Further, the invention relates to a finder screen display device for displaying information in a finder screen (view-finder screen) of an optical device such as a shooting device (e.g., a camera), a telescope or a microscope which is provided with a finder. For example, the invention relates to the finder screen display device which can display information (e.g., shooting conditions such as a shift of a shooting scope on the finder screen, shooting mode and brightness of a shooting target) superimposed on the image viewed through the finder when using the shooting device such as a camera.

The invention also relates to a finder provided with the foregoing finder screen display device, and an optical device provided with this finder.

2. Description of the Background Art

In recent years, various kinds of information devices have been developed, and thereby there has been the growing need for flat display elements having thin forms and requiring lower power consumption than CRTs. Such flat display elements may be a liquid crystal display element, a plasma display (PDP) and others. In particular, attention has been directed to an electro-luminescence element which is of a self-luminescent type and can make clear display with a large angle of view.

The electro-luminescence elements can be roughly divided into an inorganic electro-luminescence element and an organic electro-luminescence element based on materials forming the elements. The inorganic electro-luminescence elements are already put into commercial products.

However, light emission of the inorganic electro-luminescence element is of a so-called collision excitation type, in which electrons accelerated by an applied high electric field collide with luminescent center for emitting light. Therefore, a high voltage of 100 V or more must be applied for driving the element. This increases a cost of peripheral devices. Since a good luminophor for blue is not available, display in full color cannot be performed by the inorganic electro-luminescence element.

In contrast to the above, the organic electro-luminescence element (organic EL element) is of a so-called injection type, in which the charges (holes and electrons) injected from positive and negative electrodes are recoupled to form excitons in the luminophor, and the excitons excite molecules of luminescent material to emit the light. Therefore, the organic EL element can be driven with a low voltage. Further, it is easy to change the molecular structure of the luminescent material because it is the organic material. Thereby, the color of emitted light can be arbitrarily determined. Accordingly, the organic electro-luminescence element is a significantly promising display element.

The prototype of the organic electro-luminescence element has a two-layer structure provided with a hole transport layer and an electron transport layer. This element was proposed by Tang and Vanslyke [C. W. Tang and S. A VanSlyke; Appl. Phys. Lett., 51 (1987) 913]. This element is formed of a positive electrode, a hole transport layer, an electron transport luminescent layer and a negative electrode which are layered on a glass substrate.

In this element, the hole transport layer functions to inject holes from the positive electrode into the electron transport luminescent layer. The hole transport layer also prevents electrons, which are injected from the negative electrode, from escaping into the positive electrode without being recoupled with the holes, and thereby functions to confine electrons in the electron transport luminescent layer. Owing to the electron confining effect by the hole transport layer, therefore, recoupling between the electrons and holes occurs more efficiently than the element of a single luminescent layer structure, and therefore allows significant reduction in drive voltage.

Further, Saito et al. have disclosed the fact that, in the element of the two-layer structure, not only the electron transport layer but also the hole transport layer can become a luminescent layer [C. Adachi, T. Tsutsui and S. Saito; Appl. Phys. Lett., 55 (1989) 1489].

Saito et al. have proposed, as an improvement of the element of the two-layer structure, an element of a three-layer structure in which a luminescent layer is interposed between the hole and electron transport layers [C. Adachi, T. Tsutsui and S. Saito; Jpn. J. Appl. Phys. 27 (1988) L269]. This element is formed of a positive electrode, a hole transport layer, a luminescent layer, an electron transport layer and a negative electrode layered on a glass substrate. The hole transport layer functions to confine the electrons in the luminescent layer, and the electron transport layer functions to confine the holes in the luminescent layer so that the luminescence efficiency is further improved.

The negative electrode of the organic electro-luminescence element is generally formed of a film of about 100 nm in thickness, which is made of metal having a small work function and is prepared by vapor deposition on an organic layer, and is opaque. In the organic electro-luminescence element, if transparent electrodes are used not only in the positive electrode but also in the negative electrode, the element forms a self-luminescent element having transparency so that it can be applied to a wider range.

In connection with this, a transparent organic electro-luminescence element is disclosed in Japanese Laid-Open Patent Publication No. 8-185984 (185984/1996). The element taught in this publication includes an organic luminescent film formed of an electron transport layer, a luminescent layer and a hole transport layer, and also includes a transparent conductive layer as well as a transparent thin layer, which has a thickness of several nanometers, and is made of a metal or alloy thereof having a low work function. The thin layer is interposed between the organic luminescent film and the transparent conductive layer. Further, the transparent conductive layer (negative electrode) made of Indium Tin Oxide (ITO) is formed on the thin film, and a transparent conductive layer (positive electrode) made of ITO is disposed on the hole transport layer side thereof.

If the transparent conductive layer is used as the negative electrode, an energy gap between the negative electrode and the electron transport layer may increase excessively so that the efficiency of injection of electrons into the organic luminescent, film lowers, resulting in a low luminous efficiency. For overcoming the above problem, the thin layer which has a thickness of several nanometers and is made of metal or alloy thereof having a low work function is interposed between the organic luminescent film and the transparent conductive layer.

However, manufacturing of the element of the structure disclosed in Japanese Laid-Open Patent Publication No. 8-185984 suffers from the following problem because the element employs a thin layer of metal of a low work function. It is difficult to form the thin film of the metal having a low work function. Even if such a thin film is formed, oxidization or the like is likely to occur on the thin film, and therefore it is very unstable. Accordingly, it is very difficult to form a transparent conductive layer on such a thin film of the metal having a low work function.

Meanwhile, in a camera, as an example of an optical device provided with a finder, independently provided with a shooting optical system and a finder optical system, a phenomenon which is so-called "parallax" occurs as shown in FIGS. 30(A), 30(B) and 30(C). In this phenomenon, an actual shooting scope 53 of a shooting optical system 45 shifts from a finder screen 52 viewed through a finder optical system 51. According to general setting, the amount of this shift is small when a shooting distance from the camera to the shooting target is in a middle or long range, and is large when the shooting distance is short.

It is impossible to remove completely this shift in the camera which is independently provided with the shooting optical system and the finder optical system. Accordingly, as shown in FIG. 31, a parallax correction mark 54 which represents the shooting scope for the short-distance shooting is displayed on the finder screen 52 in many cases.

In the conventional camera described above, however, the parallax correction mark 54 is always displayed on the finder screen 52 shown in FIG. 31. This obstructs the view when the shooting distance is in the middle or long range and therefore the mark is not required. Such a structure has been proposed that the correction mark is displayed to show, in a dotted form, a position of a center of a shooting image when the parallax occurs. If this structure is employed together with a mechanism for macro-shooting, however, the parallax correction mark corresponding to the macro-shooting mode is displayed in the center on the finder screen, and therefore obstructs the view when viewing the shooting target during the shooting operation.

As described above, the problem relating to the parallax correction mark arises in the camera which is independently provided with the finder optical system and the shooting optical system. In addition to this problem, another problem arises, e.g., in a single-lens reflex camera in which the finder optical system is not independent of the shooting optical system. In the single-lens reflex camera, it is desired to display information relating to shooting conditions for an user on the finder screen, in addition to the foregoing shift of the shooting region on the finder screen. This additional information may be a shooting mode, a brightness of the shooting target, an autofocus region and others. The information relating to such shooting conditions is merely displayed by an LCD or by projection.

Accordingly, a back light or light source is required for information display. Further, the brightness and therefore the visibility of the shooting target image become very low when the display element is overlaid on the shooting target image.

SUMMARY OF THE INVENTION

An object of the invention is to provide an organic electro-luminescence display element having a high transparency.

Another object of the invention is to provide an organic electro-luminescence display element which entirely has a transparency, has high brightness and high luminous efficiency, and allows easy manufacturing.

Still another object of the invention is to provide an organic electro-luminescence element which has a false transparency, has high brightness and high luminous efficiency, and allows easy manufacturing.

Yet another object of the invention is to provide an organic electro-luminescence display element suitable to a finder screen display device for displaying information in a finder screen of an optical device such as a camera or another shooting device, a telescope or a microscope, which is provided with a finder (view-finder).

Further another object of the invention is to provide a finder screen display device having a good visibility.

A further object of the invention is to provide a finder screen display device, provided for a finder, which can provide a good visibility of an image viewed through the finder as well as a good visibility of information displayed by the finder screen display device.

A further object of the invention is to provide a finder screen display device which:can display, with a good visibility, information relating conditions of the image viewed through a finder in an optical device, and more specifically can display the above information superimposed on the image viewed through the finder. If the optical device is, e.g., a shooting device, the above conditions relate to a shooting condition, and more specifically relate to a shift of the shooting range in the finder screen, a shooting mode, a brightness of the shooting target, an autofocus range and others.

A further object of the invention is to provide a finder screen display device achieving a good visibility of the image viewed through the finder regardless of whether the information is displayed or not.

A further object of the invention is to provide a finder screen display device, which requires neither a back light for information display nor a light source for externally illuminating displayed contents, and therefore can have a simplified structure.

A further object of the invention is to provide a finder provided with a finder screen display device, and can provide a good visibility of an image viewed through the finder as well as a good visibility of information displayed by the finder screen display device.

A further object of the invention is to provide a finder which is provided with a finder screen display device, and has a simplified structure.

A further object of the invention is to provide an optical device which is provided with a finder having a finder screen display device, and can provide a good visibility of an image viewed through the finder as well as a good visibility of information displayed by the finder screen display device.

A further object of the invention is to provide an optical device which is provided with a finder having a finder screen display device, and has a simplified structure.

The invention provides an organic electro-luminescence display element comprising:

at least a positive electrode; an organic luminescent film; an electron injection layer and a negative electrode, wherein:

each of the positive and negative electrodes is formed of a transparent conductive film;

the electron injection layer is formed of a thin film having transparency and made of organic metal salt containing alkali metal or alkaline earth metal as the metal, halogenide of alkali metal or alkaline earth metal, or organic metal complex containing alkali metal or alkaline earth metal as the metal; and the organic metal complex is at least one selected from the group consisting of acetylacetonate complex, α-nitroso-β-naphthol complex, salicylaldoxime complex, cupferron complex, benzoinoxime complex, bipyridine complex, phenanthroline complex, crown complex, proline complex and benzoylacetone complex.

Also, the invention provides an organic electro-luminescence display element comprising at least a positive electrode, an organic luminescent film and a negative electrode, wherein the positive electrode is formed of an electrically conductive film having transparency, the negative electrode is formed of a metal film containing metal having a low work function, and the negative electrode is connected to a power supply lead portion made of a transparent and conductive film.

Further, the invention provides a finder screen display device, comprising:

an organic electro-luminescence element disposed in a light path near an image formation position of an image viewed through a finder, wherein the organic electro-luminescence element is capable of displaying information in multiple colors, and the organic electro-luminescence element is capable of displaying information superimposed on the image viewed through the finder.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a flowchart showing control for turn-on, blinking and turn-off of an organic electro-luminescence element by a control portion in a control circuit shown in FIG. 18;

FIGS. 27(A) to 27(H) show steps of manufacturing further different examples of an organic electro-luminescence element;

FIGS. 30(A), 30(B) and 30(C) show a state where parallax occurs in a camera provided with a shooting optical system and a finder optical system independent of each other;

FIG. 31 shows a parallax correction mark displayed in a finder screen of a conventional camera provided with a shooting optical system and a finder optical system independent of each other;

DESCRIPTION OF THE PREFERRED EMBODIMENTS

Figure 1:
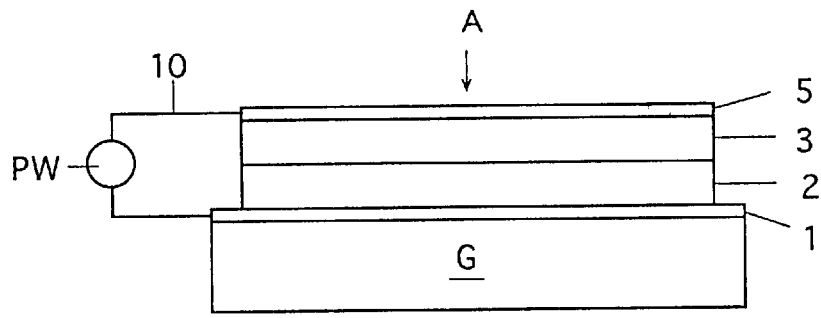
FIG. 1 schematically shows an example of a structure of an organic electro-luminescence element according to the invention.

[I] Organic Electro-Luminescence Display Element (Organic EL Display Element)

[I-1] Organic EL Display Element of a First Type

The inventors made research and found that an organic electro-luminescence display element having a good luminous efficiency can be easily and stably obtained by arranging an electron injection layer made of the following material between a organic luminescent film, including an organic luminescent layer, and a negative electrode.

The above material of the electron injection layer is organic metal salt containing alkali metal or alkaline earth metal; halogenide of alkali metal or alkaline earth metal; or specific organic metal complex containing alkali metal or alkaline earth metal. In other words, the above material of the electron injection layer is an alkali metal salt or alkaline earth metal salt of an organic compound; halogenide of alkali metal or alkaline earth metal; or a specific organic metal complex of an organic compound and an alkali metal or alkaline earth metal.

Based on the above findings, the invention provides an organic electro-luminescence display element (organic electro-luminescence display element of a first type) comprising:

at least a positive electrode; an organic luminescent film; an electron injection layer and a negative electrode, wherein:

each of the positive and negative electrodes is formed of a transparent conductive film;

the electron injection layer is formed of a thin film having transparency and made of organic metal salt containing alkali metal or alkaline earth metal as the metal (i.e., an alkali metal salt or alkaline earth metal salt of an organic compound), halogenide of alkali metal or alkaline earth metal, or organic metal complex containing alkali metal or alkaline earth metal as the metal (i.e., organic metal complex of an organic compound and an alkali metal or alkaline earth metal); and the organic metal complex is at least one selected from the group consisting of acetylacetonate complex, α-nitroso-β-naphthol complex, salicylaldoxime complex, cupferron complex, benzoinoxime complex, bipyridine complex, phenanthroline complex, crown complex, proline complex and benzoylacetone complex.

The organic electro-luminescence element of the first type employs a combination which is not known in the prior art, and more specifically a combination of the negative electrode made of the transparent conductive film and the electron injection layer made of above predetermined material, and thereby can easily and stably form the negative electrode. By using the specific electron injection layer material described above, the thin film can be formed easily by vapor deposition or the like. Accordingly, the organic EL display element which is entirely transparent can be easily formed. Further, the electron injection layer can fill an energy gap between the organic luminescent film and the negative electrode or the like made of the transparent conductive film, and therefore the organic EL display element of the first type can emit the light with high luminosity and high efficiency.

In the organic EL display element of the first type, the negative electrode may be formed of a transparent metal thin film containing metal having a work function of 4 eV or less.

In the organic EL display element of the first type, a portion of the element used for display and viewing may have a light transmittance of 70% or more with respect to visible light beams (e.g., having a wavelength from about 450 nm to about 650 nm), and more preferably 80% or more. This prevents reduction in brightness of the transparent image, which is viewed through the organic EL display element and, in other words, is the image of the subject located beyond the display element, and therefore improves the visibility of the image when the display element displays the information in a manner superimposed on the transparent image.

[I-2] Organic EL Display Element of a Second Type

The inventors made further research and found the followings:

For achieving high brightness and high luminous efficiency of the organic EL element, it is preferable that a negative electrode is made of a relatively thick film made of a metal having a low work function.

If such a relatively thick film is employed as the negative electrode, it reduces or eliminates the transparency. However, the relatively thick film may be configured to occupy a small area with respect to the whole view region of the organic EL element, whereby the transparency can be falsely achieved.

Further, the organic EL element having such false transparency may be internally arranged, e.g., in a finder of a camera, a display of a computer, a television set or a display screen of another display device, or may be internally arranged, e.g., in a windshield of a vehicle such as an automobile, a transparent cover of a meter, a window pane or the like. Even in above structures, the organic EL element having false transparency can display information by emitting light when necessary without impeding the original purpose and function.

Based on the above findings, the invention provides an organic electro-luminescence display element (organic electro-luminescence display element of a second type) having at least a positive electrode, an organic luminescent film and a negative electrode, wherein the positive electrode is formed of an electrically conductive film having transparency, the negative electrode is formed of a metal film containing metal having a low work function, and the negative electrode is connected to a power supply lead portion made of a transparent and conductive film.

In the organic EL display element of the second type, the negative electrode is formed of the metal film containing metal having a low work function, and therefore can perform luminescent display with high brightness and high luminous efficiency. Even if the negative electrode is not transparent, the organic EL display element of the second type can have the false transparency, e.g., by employing the following structure because the power supply lead portion connected to the negative electrode and the positive electrode are made of the transparent conductive film. For example, at least a portion of the negative electrode which contributes to light emission, i.e., a portion, opposed to the positive electrode, of the negative electrode may be narrowed, or may be configured to occupy a relatively small area in the display screen (view region of the element). Thereby, the organic EL element of the second type can have the false transparency.

The organic EL element of the second type may employ the following structures.

For example, at least a portion of the negative electrode directly contributing to light emission (i.e., a portion corresponding to the light emitting portion of the organic luminescent film, and thus opposed to the positive electrode via the organic luminescent film) may be made of a metal film containing magnesium or lithium. Only the portion of the negative electrode directly contributing to the light emission may be formed of the metal film containing magnesium or lithium.

For example, the positive electrode may be made of an indium tin oxide compound having transparency, the negative electrode may be formed of an opaque metal film, and a portion around the negative electrode may have a transparency.

For example, the organic luminescent film may include a hole transport-related layer disposed on the positive electrode side and an organic luminescent layer disposed on the negative electrode side, the positive electrode may be formed of a transparent and conductive metal oxide film, the negative electrode may be formed of an opaque metal film, and the power supply lead portion connected to the negative electrode may be formed of a transparent and conductive compound film.

For example, the positive electrode and a power supply lead portion to be connected to the positive electrode may be formed of a patterned ITO (Indium Tin Oxide) film on a transparent substrate, and the negative electrode may be formed of an opaque metal film.

For example, a line forming the negative electrode may have a width of 1 mm or less. This can achieve false transparency of the organic EL display element. The lower limit of the width of the line forming the negative electrode is not particularly restricted, but may be in a range allowed on the basis of accuracy of a mask which is used for forming the negative electrode. Although depending on the manner of forming the negative electrode, the line width of the negative electrode may be reduced to about 10 $\mu$m.

For example, the organic electro-luminescence display element may be disposed between two (i.e., paired) glass substrates in a sealed fashion.

For example, an area occupied by a light emitting portion in the organic luminescent film may be 1/10 or less of a whole view region of the display element. In other words, the area of the luminescent display portion in the organic EL display element may be 1/10 or less of the whole area of the view region including the luminescent display portion and the transparent portion located around the luminescent display portion. This can suppress such a disadvantage that the luminescent display portion obstructs the transparent image, which is viewed through the organic EL display element (i.e., the image of the subject viewed beyond the display element), when the display element displays the information superimposed on the transparent image.

[I-3] The Following Structure may be Employed in Either of the Organic EL Display Elements of the First and Second Types.

For example, a thickness between the positive and negative electrodes may be in a range from 20 nm to 200 nm. This can suppress breakdown of the display element, and can lower the required drive voltage.

For example, a luminescent layer in the organic luminescent film may be doped with fluorescent dye. In this structure, a wavelength of the emitted light of the display element can be selected by selecting the fluorescent dye to be doped. Further, the luminous efficiency and the lifetime of the element can be improved.

For example, the positive and negative electrodes may be arranged to perform simple matrix driving of the display element. More specifically, the positive and negative electrodes may have configurations allowing the simple matrix driving of the display element. This simplifies the structure of the display element, and allows easy manufacturing of the element. Further, this increases the transparency of the whole display screen.

The organic luminescent film may have following structures in either of the organic EL display elements of the first and second types.

For example, the organic luminescent film may include:
(a1) a hole transport-related layer and an organic luminescent layer layered in this order from the positive electrode side to the negative electrode side,
(a2) a hole transport-related layer, an organic luminescent layer and an electron transport-related layer layered in this order from the positive electrode side to the negative electrode side, or
(a3) an organic luminescent layer and a electron transport-related layer layered in this order from the positive electrode side to the negative electrode side.

The hole transport-related layer and the electron transport-related layer may be arranged, if necessary, in accordance with characteristics of the electrodes and characteristics of the organic luminescent layer.

The hole transport-related layer may be one selected from a group consisting of (b1) a hole injection layer, (b2) a hole transport layer, (b3) a hole injection layer and a hole transport layer, and (b4) a hole injection/transport layer.

The electron transport-related layer may be one selected from a group consisting of (c1) an electron injection layer, (c2) an electron transport layer, (c3) an electron injection layer and an electron transport layer, and (c4) an electron injection/transport layer.

These layers may be appropriately selected in accordance with the characteristics of the electrodes and the characteristics of the organic luminescent layer.

For example, by doping fluorescent dye into entire or partial of the hole transport layer or the hole injection/transport layer, or by doping fluorescent dye into entire or partial of the electron transport layer or the electron injection/transport layer, the entire or partial of the layer doped with the fluorescent dye may be the luminescent layer.

Each of the organic EL display elements (organic EL elements) of the first and second types can be applied to a wide field, e.g., relating to:

a display for in-finder of a camera, a microscope, a telescope and others, an illumination device of a dial of a watch or a clock, displays or illumination devices each internally arranged in a window pane or another transparent plate, e.g., used in a glass tank, head-up displays, e.g., for an automobile and a train, a display internally arranged in a door mirror or a rear-view mirror of a vehicle such as an automobile, and an overlay display to be overlaid with another display screen, a display internally arranged in a trace tablet and a fluorescent display toy.

The organic EL display element of either of the first and second types can be applied to following finder screen display devices for displaying information on the finder screens, respectively. A finder provided with the finder screen display device can employ the organic EL display element of either of the first and second types. The organic EL display element of either of the first and second types can be applied to optical devices( such as a camera, a microscope and a telescope) provided with the finder and the finder screen display device. In the finder screen display device, the finder and the optical device, which employ the organic EL display elements of either the first or second type, the image viewed through the finder as well as the information displayed by the organic EL display element can have good visibility.

[II] Finder Screen Display Device, Finder And Optical Device

[II-1] Finder Screen Display Device

The invention provides finder screen display devices of the following first to eighth types.

Each of the finder screen display device of the following types displays information in a manner superimposed on an image viewed through a finder. Each of the finder screen display device of the following types employs the organic EL element (organic EL display element) for information display.

(1) Finder Screen Display Device of the First Type

A finder screen display device of the first type comprises an organic electro-luminescence element disposed in a light path near an image formation position of an image viewed through a finder, wherein the organic electro-luminescence element is capable of displaying information in multiple colors, and the organic electro-luminescence element is capable of displaying information superimposed on the image viewed through the finder.

In the finder screen display device of the first type, the organic EL element can display the information in multiple colors.

For example, the organic EL element may be configured to change the luminescent color of the same portion for displaying the information in multiple colors. For example, the color of information displayed at the same portion of the organic EL element may be changed in accordance with the information to be displayed. Although depending on the structure of the organic EL element and others, drive conditions such as a voltage applied across the electrodes may be changed, whereby the luminescent color of the same portion of the organic EL element can be changed.

The organic EL element may be configured to display the information in different colors at different portions, respectively. This allows, e.g., simultaneous display of information in multiple colors. The organic EL element may be formed of, e.g., three or more divided portions capable of independent light emission to. each other, in which case it is merely required that at least one of the divided portions can emit the light in a color different from those of the other portions. In the case where each portion of the organic EL element is configured, e.g., to perform predetermined information display, a plurality of items of information can be simultaneously displayed in different colors, respectively, which increases the visibility of the plurality of items of information.

(2) Finder Screen Display Device of the Second Type

A finder screen display device of the second type comprises an organic electro-luminescence element disposed in a light path near an image formation position of an image viewed through a finder, wherein a luminescent layer of the element is doped with fluorescent dye; the organic electro-luminescence element is capable of displaying information on different portions in different luminescence colors; and the organic electro-luminescence element can display information superimposed on the image viewed through the finder.

(3) Finder Screen Display Device of the Third Type

A finder screen display device of the third type comprises an organic electro-luminescence element disposed in a light path near an image formation position of an image viewed through a finder; wherein the organic electro-luminescence element is capable of displaying information on different portions in different luminescence colors; the organic electro-luminescence element can display information superimposed on the image viewed through the finder; and an information display portion of the element is divided into a plurality of portions each having a transparent portion and an opaque portion.

In the finder screen display device of the third type, the opaque portion of the organic electro-luminescence element may be, e.g., located near a screen frame in the finder screen.

(4) Finder Screen Display Device of the Fourth Type

A finder screen display device of the fourth type comprises an organic electro-luminescence element disposed in a light path near an image formation position of an image viewed through a finder, wherein the organic electro-luminescence element can display information superimposed on the image viewed through the finder; and a single luminescent portion of the organic electro-luminescence element can perform display in different luminescence colors depending on drive conditions.

In the finder screen display device of the fourth type, the organic EL element may entirely and substantially have transparency.

The organic EL element may be formed of, e.g., at least a positive electrode, a first luminescent layer, a blocking layer preventing movement of holes or electrons, a second luminescent layer and a negative electrode. Colors of light emitted from the first and second charge luminescent layers may be different from each other. All the positive electrode, first luminescent layer, blocking layer, second luminescent layer and negative electrode may substantially have transparency.

The organic EL element may be formed of two or more layer structures layered together and each including at least a positive electrode, a luminescent layer and a negative electrode, and the positive electrode, the luminescent layer and the negative electrode may substantially have transparency.

(5) Finder Screen Display Device of the Fifth Type

A finder screen display device of the fifth type comprises an organic electro-luminescence element disposed in a light path near an image formation position of an image viewed through a finder, wherein an information display portion of the element is divided into a plurality of portions; the plurality of divided portions include a transparent portion for display in a predetermined luminescence color and an opaque portion for display in a luminescence color different from the luminescence color of the transparent portion; the transparent portion is arranged on a position superimposed on. the image viewed through the finder; and the opaque portion is disposed in a position not related to the image viewed through the finder.

(6) Finder Screen Display Device of the Sixth Type

A finder screen display device of the sixth type comprises an organic electro-luminescence element disposed in a light path near an image formation position of an image viewed through a finder, wherein the organic electro-luminescence element can display information superimposed on the image viewed through the finder; a portion of the organic electro-luminescence element for displaying the information superimposed on the image viewed through the finder is divided into a plurality of portions; and each of the divided portions can emit light in different luminescence color, and can be driven independently of each other.

(7) Finder Screen Display Device of the Seventh Type

A finder screen display device of the seventh type comprises an organic electro-luminescence element, wherein the organic electro-luminescence element is disposed in a light path near an image formation position of an image viewed through a finder; and the organic electro-luminescence element is the organic electro-luminescence display element of the foregoing first type according to the invention, and can display information superimposed on the image viewed through the finder.

(8) Finder Screen Display Device of the Eighth Type

A finder screen display device of the eighth type comprises an organic electro-luminescence element, wherein the organic electro-luminescence element is disposed in a light path near an image formation position of an image viewed through a finder; and the organic electro-luminescence element is the organic electro-luminescence display element of the foregoing second type according to the invention, and can display information superimposed on the image viewed through the finder.

[II-2]

Any one of the finder screen display device of the foregoing first to eighth types can be utilized, e.g., for information display in a finder of an optical device such as a camera or the like which is provided with an optical system for formation of an image passes through a lens.

In the finder screen display device of any one of the foregoing first to eighth types, the organic EL element is disposed in a light path near the formation position of the image viewed through the finder. Therefore, the image can be seen or observed through the finder when the organic EL element is not performing information display. When the organic EL element is performing information display, information is displayed with emitted light of the organic EL element in a manner superimposed on the image viewed through the finder.

In the finder screen display device of any one of the foregoing first to eighth types, it is desired that the organic EL element entirely has transparency. However, even in the case where the organic EL element is partially opaque, this is allowed if the opaque portion does not obstruct the view as a whole, and thus the element substantially has the transparency. In either of the above cases, the negative and positive electrodes of organic EL element may be formed of, e.g., a material having transparency. The electrode material having the transparency may be electroconductive metal oxide such as tin oxide, indium oxide, zinc oxide, zirconium oxide, indium tin oxide compound usually referred to as "ITO", and like. The negative or positive electrode may be formed of a thin film made of metal such as gold, silver, magnesium, indium or the like, and having transparency.

By employing the organic EL element which substantially has the transparency as a whole as described above, the good visibility of the image viewed through the finder can be achieved regardless of whether the information display is being performed or not. Since the organic EL element is disposed near the formation position of the image viewed through the finder, the organic EL element can clearly display the information. When the organic EL element can display information in multiple luminous colors, the displayed information can be recognized more easily.

The organic EL elements employed for information display in the finder screen display devices of the first to eighth types do not require a back light or projection mechanism, which is required in a liquid crystal display or a projection display device. This simplifies the structure in the finder screen display device. Accordingly, the finder screen display device according to the invention can achieve the high visibility of the displayed contents in the finder, lowering of the required light emission start voltage, increase in luminous intensity, high stability during repetitive use and good visibility, and requires only the simple structure for achieving these advantages.

In any one of the finder screen display device of the first to eighth types, the information displayed by the organic EL element may be, e.g., the information representing conditions of viewing. In the case where the finder screen display device is arranged in a shooting device such as a camera, the information representing the viewing conditions may be, e.g., one or more of a shift of the shooting region on the finder screen, the shooting mode, the brightness of the shooting target and an autofocus region. The organic EL element may be performed to display one or more items of information among the information relating to the shift of the shooting region, the shooting mode, the brightness, the autofocus region, the imaging area and the focused area.

In any one of the finder screen display device of the first to eighth types, a liquid crystal display may be employed as the information display element in addition to the organic EL element. In this case, the organic EL element may be driven, e.g., in a static drive manner. The liquid crystal display may be driven, e.g., in a simple matrix drive manner.

In any one of the finder screen display device of the first to eighth types, the organic EL element may be configured to display multiple items of information in individually determined forms, respectively. For example, the organic EL element may be formed of a plurality of divided portions, each of which can emit the light independently of the others and has a form suitable to the information contents to be displayed. This is true even in the case where the liquid crystal display for information display is additionally employed.

[II-3]

In any one of the finder screen display device of the first to sixth types, the organic EL element for information display may be of a known type.

In any one of the finder screen display device of the first to sixth types, the organic EL element for information display may be the organic EL display element of the first or second type according to the invention, whereby the foregoing advantages can likewise be achieved.

In any one of the finder screen display device of the first to sixth types, the organic EL element for information display may employ the following structures.

The organic EL element may include, e.g., at least a positive electrode, a hole transport layer, a luminescent layer and a negative electrode. The positive electrode may be formed of a thin film of ITO. The negative electrode may be formed of a thin metal film having transparency.

The organic EL element may include, e.g., at least a positive electrode, a hole transport layer, a luminescent layer and a negative electrode, and each of the positive and negative electrode may be formed of a thin film made of a metal oxide compound and having transparency and electric conductivity.

The organic EL element may include, e.g., at least a positive electrode, a hole transport layer, a luminescent layer, an electron injection layer and a negative electrode. The electron injection layer may be formed of a transparent metal thin film containing metal having a work function of 4.5 eV or less, and each of the positive and negative electrodes may be formed of an electric conductive thin film having transparency and made of metal oxide.

The organic EL element may include, e.g., at least a positive electrode, a hole injection layer, a hole transport layer, a luminescent layer, an electron injection layer and a negative electrode, and each of the positive and negative electrodes may be formed of an electrically conductive thin film having transparency and made of metal oxide.

The organic EL element may include, e.g., at least a positive electrode, a first electric charge transport layer, a luminescent layer, a second electric charge transport layer and a negative electrode. Each of the first and second electric charge transport layers may be made of a hole transporting compound or an electron transporting compound, and the luminescent layer may be doped with two or more kinds of fluorescent dye.

The organic EL element may include, e.g., at least a positive electrode, a first electric charge transport layer, a luminescent layer, a second electric charge transport layer and a negative electrode. Each of the first and second electric charge transport layers may be made of a hole transporting compound or an electron transporting compound, and the luminescent layer may be doped with two or more kinds of fluorescent dye. Each of the positive and negative electrodes may be formed of a transparent thin film made of an electrically conductive compound.

The organic EL element may include, e.g., at least a positive electrode, a first luminescent layer, a blocking layer for preventing movement of holes or electrons, a second luminescent layer and a negative electrode, and colors of light emitted from the first and second luminescent layers may be different from each other.

The organic EL element may include, e.g., at least a positive electrode, a first luminescent layer, a blocking layer for preventing movement of holes or electrons, a second luminescent layer and a negative electrode, colors of light emitted from the first and second luminescent layers may be different from each other, and each of the positive electrode, the first luminescent layer, the blocking layer, the second luminescent layer and the negative electrode substantially may have transparency.

The organic EL element may have, e.g., two or more layer structures layered together and each including a positive electrode, a luminescent layer and a negative electrode, and the positive electrode, the luminescent layer and the negative electrode located between the outermost positive electrode and the outermost negative electrode may substantially have transparency.

[II-4] Finder and Optical Device

The invention also provides a finder provided with the finder screen display device of any one of the foregoing first to eighth types. This finder has the advantages already described in connection with the finder screen display device.

The invention further provides an optical device provided with a finder and the finder screen display device of any one of the foregoing first to eighth types. This optical device has the advantages already described in connection with the finder screen display device.

[III] Embodiments of the Invention will now be Described Below with Reference to the Drawings FIGS. 1 to 9 schematically show, by way of example, structures of organic electro-luminescence elements according to the invention.

In the organic electro-luminescence elements shown in FIGS. 1 to 9, portions achieving the same functions bear the same reference numbers and symbols.

An organic electro-luminescence element A shown in FIG. 1 includes a positive electrode 1, a hole injection/transport layer 2, an organic luminescent layer 3 and a negative electrode 5 which are layered on a transparent substrate G in this order.

Figure 2:
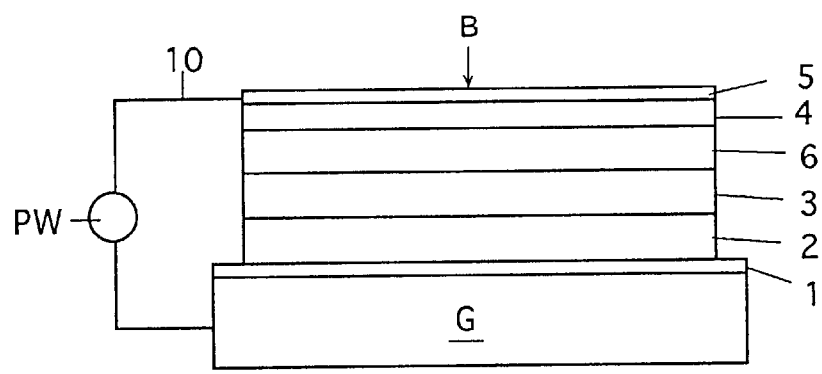
FIG. 2 schematically shows a structure of another example of an organic electro-luminescence element according to the invention.

An organic electro-luminescence element B shown in FIG. 2 includes the positive electrode 1, the hole injection/transport layer 2, the organic luminescent layer 3, an electron transport layer 6, an electron injection layer 4 and the negative electrode 5 which are layered on the transparent substrate G in this order.

Figure 3:
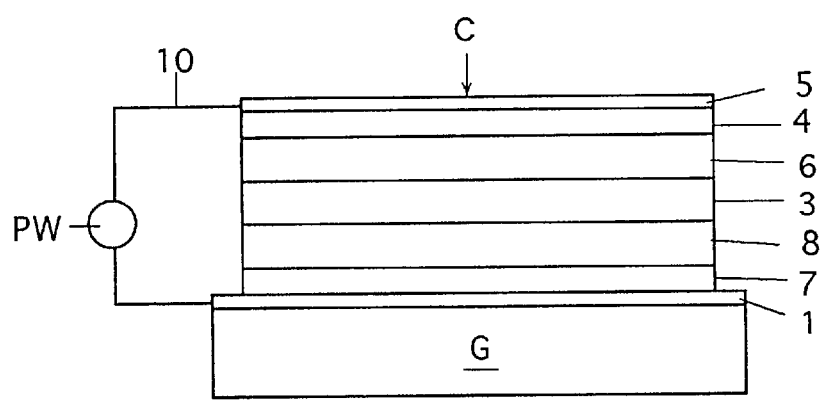
FIG. 3 schematically shows a structure of still another example of an organic electro-luminescence element according to the invention.

An organic electro-luminescence element C shown in FIG. 3 includes the positive electrode 1, a hole injection layer 7, a hole transport layer 8, the organic luminescent layer 3, the electron transport layer 6, the electron injection layer 4 and the negative electrode 5 which are layered on the transparent substrate G in this order.

Figure 4:
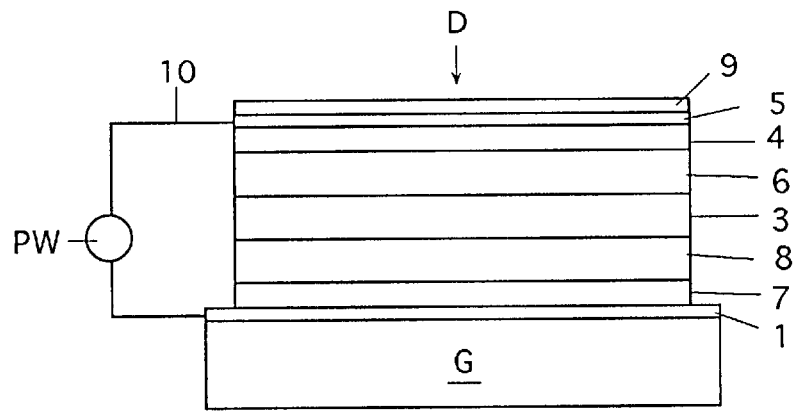
FIGS. 4 to 9 schematically shows structures of further different examples of an organic electro-luminescence element according to the invention, respectively.

An organic electro-luminescence element D shown in FIG. 4 is a modification of the display element C, and includes the positive electrode 1, the hole injection layer 7, the hole transport layer 8, the organic luminescent layer 3, the electron transport layer 6, the electron injection layer 4, the negative electrode 5 and a sealing film 9 which are layered on the transparent substrate G in this order.

Figure 5:
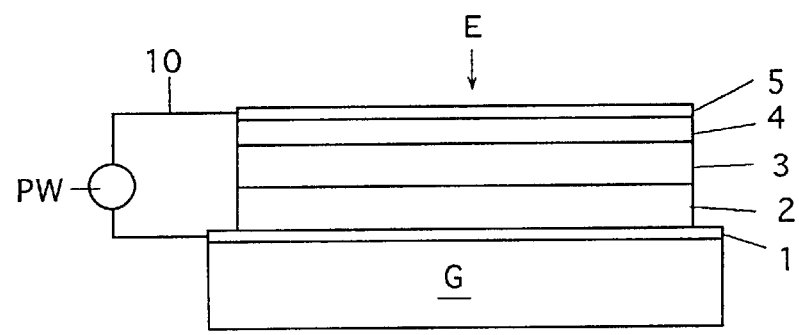

An organic electro-luminescence element E shown in FIG. 5 includes the positive electrode 1, the hole injection/transport layer 2, the organic luminescent layer 3, the electron injection layer 4 and the negative electrode 5 which are layered in this order on the transparent substrate G.

Figure 6:
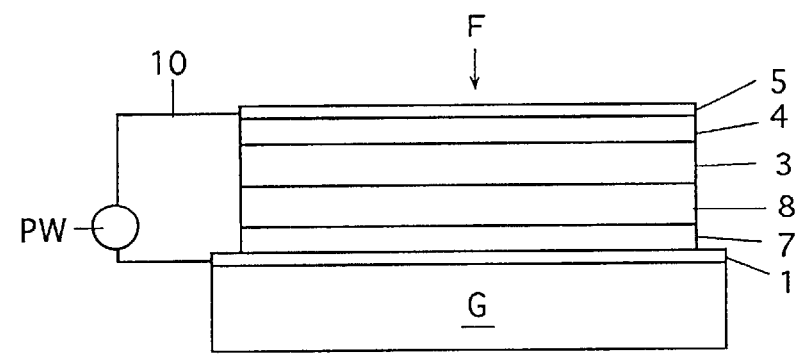

An organic electro-luminescence element F shown in FIG. 6 includes the positive electrode 1, a hole injection layer 7, a hole transport layer 8, the organic luminescent layer 3, the electron injection layer 4 and the negative electrode 5 which are layered in this order on the transparent substrate G.

Figure 7:
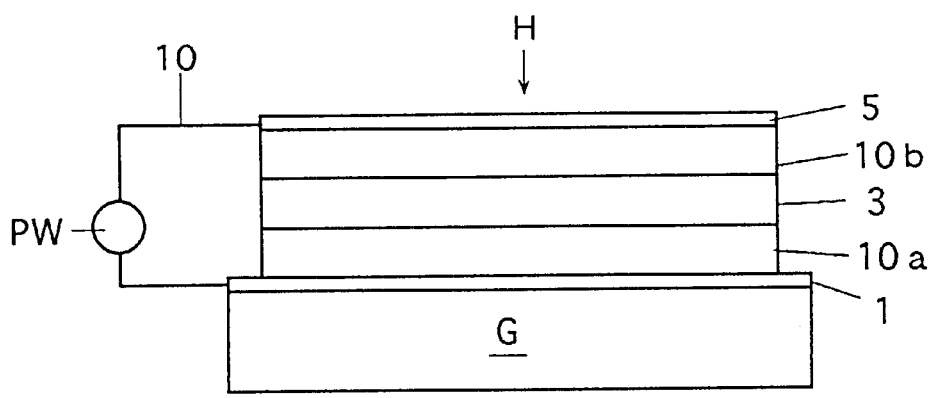

A display element H shown in FIG. 7 includes the positive electrode 1, an electric charge transport layer 10*a* made of a hole transporting compound or an electron transporting compound, the organic luminescent layer 3, an electric charge transport layer 10*b* made of a compound having the same kind of charge transportability as the charge transport layer 10*a,* and the negative layer 5 which are layered in this order on the transparent substrate G.

Figure 8:
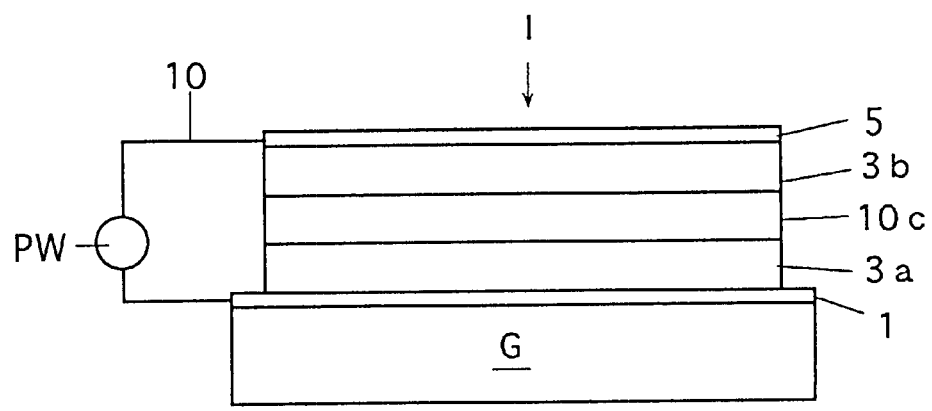

An organic electro-luminescence element I shown in FIG. 8 includes the positive electrode 1, a first organic luminescent layer 3*a,* a blocking layer 10*c* made of a hole transporting compound or an electron transporting compound, a second organic luminescent layer 3*b* and the negative electrode 5 which are layered in this order on the transparent substrate G.

Figure 9:
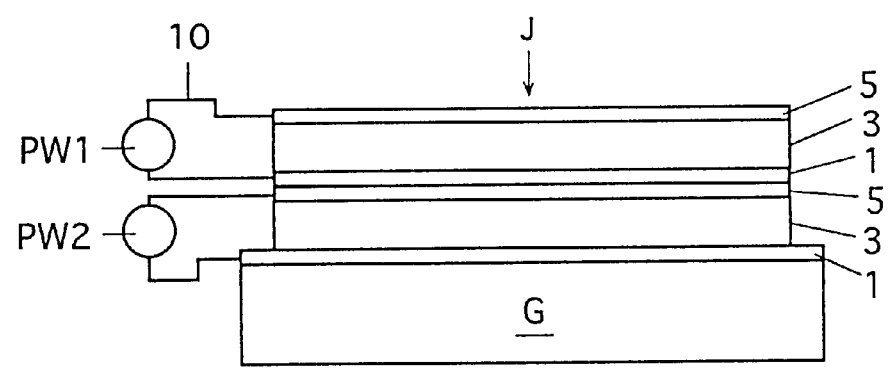

An organic electro-luminescence element J shown in FIG. 9 includes two layer structures, which are layered on the transparent substrate G and each are formed of the positive electrode 1, the organic luminescent layer 3 and the negative electrode 5.

In any one of the foregoing organic electro-luminescence elements, the organic luminescent layer 3 emits the light when a power source PW applies a predetermined voltage across the positive and negative electrodes 1 and 5. In the element J shown in FIG. 9, however, the layer structures are supplied with the voltages from power sources PW1 and PW2, respectively. only one power source may be employed, and a switch may be employed for selecting the structure to be supplied with the voltage.

Two or more elements each having one of the structures shown in FIGS. 1 to 7 may be layered. Alternatively, two or more kinds of the luminescent layers may be combined with the hole transport-related layer or the electron transport-related layer, and may be disposed between the positive and negative electrodes, as is done in the display elements shown in FIGS. 8 and 9. In these structures, a variable voltage is applied across the electrodes for changing the color of light. In these and other elements having two or more organic luminescent layers, display in multiple colors can be performed, or display in different colors can be performed at the same display portion.

In the case where the two or more organic luminescent layers are employed, the respective luminescent layers may be doped with different kinds of fluorescent dye, and may be supplied with electric fields, in different directions. Alternatively, the respective luminescent layers may be made of different luminescent materials, and may be supplied with the electric fields in different directions. Thereby, the respective luminescent layers can emit the light in variable colors. The luminescent layer may be doped with two or more kinds of fluorescent dye, and the voltage applied thereto may be controlled, whereby the color of the emitted light can be changed. For example, the display element H of the structure shown in FIG. 7 may have three luminescent layers 3, and the upper and lower luminescent layers located on the opposite sides of the middle luminescent layer are doped with different kinds of fluorescent dye, respectively. Thereby, the color of the light emitted from the display element H can be changed by switching the electric field applied across the negative and positive electrodes between the forward and reverse directions. In the display element I of the structure shown in FIG. 8, the first and second luminescent layers 3*a* and 3*b* may be formed of different kinds of luminescent materials. Thereby, the color of the light emitted from the display element I can be changed by switching the electric field applied across the negative and positive electrodes between the forward and reverse directions.

In summary, the appropriate structures can be selectively employed for achieving the objects of the invention.

In the structure provided with the hole injection layer or the electron injection layer, the injection ability of the holes or electrons is improved so that the luminous efficiency is improved and the device can have a long lifetime. The luminescent layer may be doped with a slight amount of fluorescent dye having a high fluorescent quantum effect, whereby an arbitrary light color can be obtained. The doping of the fluorescent dye can significantly improve the luminous efficiency of the element. Thereby, it is possible to lower the required light emission start voltage for light emission of the organic electro-luminescence element, which is used in the finder screen display device according to the invention, so that light emission can be stably performed for a long time.

Likewise, provision of the hole transport layer or the electron transport layer improves the transporting ability of the holes or electrons so that the luminous efficiency can be improved.

In any one of the foregoing organic electro-luminescence elements, the transparent substrate G may be selected from various materials provided that it has an appropriate strength, is not adversely affected by heat during formation of the organic EL element, film deposition or the like, and is transparent. For example, the substrate G may be formed of a glass substrate, or may be made of transparent resin such as polyethylene, polypropylene, polyethersulfon or polyether ether ketone.

The organic electro-luminescence element according to the invention can be formed by successively layering the positive electrode, organic luminescent layer, negative electrode and others on the transparent substrate.

The positive electrode is made of an electric conductive material.

The material of the positive electrode preferably has a work function larger than 4.5 eV, and may be selected from metal such as carbon, vanadium, iron, cobalt, nickel, copper, zinc, tungsten, silver, tin and gold; alloy thereof; electroconductive metal compounds, for example, metal oxide such as tin oxide, indium oxide, antimony oxide, zinc oxide, zirconium oxide and molten solid of such metal oxide (e.g., molten solid of indium oxide and tin which is known as ITO), and mixture of these metal oxides.

It is desired that the positive electrode is transparent so that a viewer can view the light emitted from the element.

For improving the transparency of the positive electrode, it is preferable to use a conductive material, as the material of the positive electrode, having a work function larger than about 4 eV. Such a material may be selected from electroconductive compounds, for example, metals such as carbon, aluminum, vanadium, iron, cobalt, nickel, copper, zinc, tungsten, silver, tin and gold; alloys of these metals; electroconductive metal compounds, for example, metal oxides such as tin oxide, indium oxide, antimony oxide, zinc oxide, zirconium oxide, molten solid or mixtures of these metal oxides.

In the process of forming the positive electrode, the foregoing conductive material is applied onto the transparent substrate by vapor deposition, sputtering or sol-gel method, or by applying resin containing such material in a dispersed fashion onto the substrate so that the desired transparency and conductivity may be ensured.

The film thickness of the positive electrode depends on whether it is made of metal or an electrically conductive metal compound, and can be generally determined in a range from about 10 Å to 2000 Å for achieving the transparency.

For achieving the high transparency, the thickness of the positive electrode made of metal is preferably in a range from about 1 nm to about 10 nm, and more preferably in a range from about 1 nm to about 8 nm. In the case where the positive electrode is made of a conductive compound such as a conductive metal oxide or another conductive metal compound, the thickness of the positive electrode is preferably in a range from about 10 nm to about 300 nm.

The transparent substrate and the positive electrode may be formed of a glass substrate and a transparent electrode formed thereon. For example, it is possible to employ, e.g., a structure in which a transparent electrode made of ITO (Indium Tin Oxide) is arranged on the glass substrate, or a structure in which a transparent electrode is formed on the glass substrate, which is generally called "NESA glass" and manufactured by CORNING Corp.

The negative electrode may be formed of a metal film containing metal having a low work function. The material of the negative electrode preferably contains metal having a low work function lower than 4.5 eV, and may be selected from aluminum, indium, magnesium, calcium, titanium, yttrium, lithium, gadolinium, ytterbium, ruthenium, manganese and alloys of these metals.

Although the electron injection ability lowers, the negative electrode may be formed in a small thickness with the foregoing conductive metal compound selected, e.g., from tin oxide, indium oxide, antimony oxide, zinc oxide, zirconium oxide and ITO, or with the foregoing metal alloy having a low work function, and this thin negative electrode may be covered with a transparent and conductive metal compound. By employing the negative electrode described above, not only the positive electrode but also the negative electrode have the transparency so that the light emitted from the transparent element can be viewed.

In the process of forming the negative electrode, the foregoing conductive material is applied by vapor deposition, sputtering or sol-gel method, or by applying resin containing such material in a dispersed fashion so that the desired transparency and conductivity can be ensured.

The negative electrode may be formed of a thin metal film containing metal which has a low work function of 4 eV or less. For example, the material of such a metal thin film may be selected from magnesium, calcium, titanium, yttrium, lithium, gadolinium, ytterbium, ruthenium, manganese and alloys containing these metals.

If the negative electrode is formed of the thin metal film having a low work function, the thickness thereof is preferably in a range from 10 nm to 500 nm in view of the conductivity and manufacturing stability. However, for ensuring the transparency, the thickness of the negative electrode is preferably in a range from 1 nm to 10 nm, and more preferably in a range from 1 nm to 8 nm. For stable element characteristics and small resistance value of the negative electrode, it is preferable to provide a coating made of a transparent and conductive metal compound such as ITO and having a thickness in a range from 10 nm to 500 nm. If a transparent material such as a conductive metal oxide having transparency is used as the negative electrode, the thickness of the negative electrode is preferably in a range from 10 nm to 300 nm.

In the display element shown in FIG. 4, the sealing film 9 is arranged above the negative electrode 5. This sealing film prevents entry of moisture and oxygen into the respective layers forming the organic electro-luminescence element. The sealing film may be employed in organic EL elements of other structures.

The sealing film may be,made of a material selected from metal oxide such as MgO, SiO, $SiO_2$, $Al_2O_3$, GeO, NiO, CaO, BaO, $Fe_2O_3$, $Y_2O_3$ or $TiO_2$, may be made of a metal fluoride such as $MgF_2$, LiF, $AlF_3$ or $CaF_2$, or may be made of the foregoing tin oxide or another conductive metal oxide.

The negative electrode may be provided with a lead portion for power supply made of a transparent conductive film. The transparent conductive film forming the power supply lead portion for the negative electrode is preferably made of a material having a work function of about 4 eV or more, and may be made of a material selected from electroconductive materials, for example, metals such as aluminum, vanadium, iron, cobalt, nickel, copper, zinc, tungsten, silver, tin and gold; alloys of these metals; electroconductive metal compounds, for example, metal oxides such as tin oxide, indium oxide, antimony oxide, zinc oxide, zirconium oxide and molten solid, and mixtures of these metal oxides.

The foregoing conductive material is applied by vapor deposition, sputtering or sol-gel method, or by applying resin containing such material in a dispersed fashion so that the power supply lead portion having desired transparency and conductivity can be formed.

For obtaining the transparency, the power supply lead portion made of metal preferably has a thickness in a range from about 1 nm to about 30 nm, and the power supply lead portion made of a conductive compound such as a conductive metal compound preferably has, a thickness in a range from 1 nm to 300 nm.

If necessary, the positive electrode may be provided with the lead portion for power supply, which is made of a material similar to that of the power supply lead portion for the negative electrode.

The element structure and the manufacturing method thereof will now be described with reference to the display element shown in FIG. 6.

The hole injection layer 7 is formed on the positive electrode 1 which is already formed on the transparent substrate G.

The hole injection layer may be formed by vapor deposition of the compound which is a hole injection material, or may be formed by application in the dip coating method or a spin coating method using liquid solution of the above compound or liquid solution of the compound and appropriate resin.

If the hole injection layer is formed by vapor deposition, the thickness may be in a range from about 1 nm to about 20 nm. If it is formed by application, the thickness may be in a range from about 1 nm to about 50 nm.

By employing the hole injection layer, the luminous efficiency is improved, and a leak current in a minute portion of the positive electrode interface can be effectively prevented so that occurrence of a dark spot can be prevented, and thereby the lifetime of element can be increased.

The hole injection material for forming the hole injection layer may be selected from porphorin ring compounds such as copper-phthalocyanine; indanthrene pigment; carbon membrane; electroconductive polymer membranes such as polyaniline and polythiophene; star-burst type compounds such as 4,4',4"-tris(N-carbazolyl)triaminotriphenylamine, N,N',N"-triphenyl-N,N',N"-tris(3-methylphenyl)-1,3,5-tri (4-aminophenyl)benzene and 4,4',4"-tris(N,N',N"-triphenyl-N,N',N"-tris(3-methylphenyl))triaminotriphenylamine.

Then, the hole transport layer 8 is formed.

The hole transport layer or the hole injection/transport layer may be formed by vapor deposition of the compound which is a hole transport material, or may be formed by application method such as a dip coating method or a spin coating method using liquid solution of above compound or liquid solution of the compound and appropriate resin.

In the case where the hole transport layer is formed by vapor deposition, the thickness thereof may be in a range from about 10 nm to about 100 nm. If the hole transport layer is formed by application method, the thickness may be in a range from about 10 nm to about 200 nm. When the hole injection/transport layer is formed by the vapor deposition, the thickness thereof may be in a range from about 1 nm to about 500 nm. If the hole injection/transport layer is formed by application method, the thickness may be in a range from about 5 nm to about 1000 nm.

As the thickness of the hole transport layer or the hole injection/transport layer increases, the voltage applied thereto for light emission must be increased, and therefore the luminous efficiency lowers so that the organic electroluminescence element is likely to deteriorate. As the thickness decreases, the luminous efficiency increases, but the breakdown is likely to occur so that the lifetime of the organic electro-luminescence element becomes short.

Accordingly, the thicknesses are determined in the foregoing ranges in view of the luminous efficiency and the lifetime of the element.

The hole transport layer and the hole injection/transport layer can be made of a known hole transport material.

The hole transport material may be selected from N,N'-diphenyl-N,N'-bis(3-methylphenyl)-1,1'-diphenyl-4,'-diamine, N,N'-diphenyl-N,N'-bis(4-methylphenyl)-1,1'-diphenyl-4,4'-diamine, N,N'-diphenyl-N,N'-bis(1-naphthyl)-1,1'-diphenyl-4,4'-diamine, N,N'-diphenyl-N,N'-bis(2-naphthyl)-1,1'-diphenyl-4,4'-diamine, N,N'-tetra(4-methylphenyl)-1,1'-diphenyl-4,4'-diamine, N,N'-tetra-(4-methylphenyl)-1,1'-bis(3-methylphenyl)-4,4'-diamine, N,N'-diphenyl-N,N'-bis(3-methylphenyl)-1,1'-bis(3-methylphenyl)-4,4'-diamine, N,N'-bis(N-carbazolyl)-1,1'-diphenyl-4,4'-diamine, 4,4',4"-tris(N-carbazolyl) triaminotriphenylamine, N,N',N"-triphenyl-N,N',N"-tris(3-methylphenyl)-1,3,5-tri(4-aminophenyl)benzene, 4,4',4"-tris[N,N',N"-triphenyl-N,N',N"-tris(3-methylphenyl)] triaminotriphenylamine, N,N'-diphenyl-N,N'-bis(4-methylphenyl)-1,1'-bis(3-methylphenyl)-4,4'-diamine, N,N'-diphenyl-N,N'-bis(4-methylphenyl)-1,1'-bis(3-methylphenyl)-4,4'-diamine, 4,4',4"-tris(N-carbazolyl)triphenylamine, 4,4',4"-tris[N,N',N"-triphenyl-N,N',N"-tris(3-methylphenyl)]triphenylamine.

Also, two or more among these materials may be used in a mixed form.

Then, the organic luminescent layer 3 is formed on the hole transport layer 8. The organic luminescent layers including the organic luminescent layer 3 in the display element according to the invention may be made of the known organic luminescent material or the known organic luminous member.

For example, it may be selected from epindolidione, 2,5-bis[5,7-di-t-pentyl-2-benzoxazolyl]thiophene, 2,2'-(1,4-phenylenedivinylene)bisbenzothiazole, 2,2'-(4,4'-biphenylene)bisbenzothiazole, 5-methyl-2-{2-[4-(5-methyl-2-benzoxazolyl)phenyl]vinyl}benzoxazole, 2,5-bis(5-methyl-2-benzoxazolyl)thiophene, anthracene naphthalene, phenanthrene, pyrene, chrysene, perylene, perynone, 1,4-diphenylbutadiene, tetraphenylbutadiene, coumarin, acrydine, stilbene, 2-(4-biphenyl)-6-phenylbenzoxazole, aluminum trisoxine, magnesium bisoxine, zinc bis(benzo-8-quinolinol), bis(2-methyl-8-quinolinolato)aluminum oxide, indium trisoxine, aluminum tris(5-methyloxine) lithium oxine, gallium trisoxine, calcium bis(5-chloroxine), poly zinc bis(8-hydroxy-5-quinolinolyl)methane, dilithium epindolidione, zinc bisoxine, 1,2-phthaloperynone, 1,2-naphthaloperynone, polyphenylenevinylene compound, beryllium dibenzoxine, poly(2,5-dinoryloxy-p-phenylenevinylene), pentaphenylcyclopentadiene.

Also, it may be selected from conventional fluorescent dyes such as fluorescent coumarin dye, fluorescent perylene dye, fluorescent pyran dye, fluorescent thiopyran dye, fluorescent polymethine dye, fluorescent merocyanine dyes and fluorescent imidazole dye. Among them, the chelated oxynoide compound is the preferable material.

The organic luminescent layer may be formed by vapor deposition of the foregoing organic luminescent material, or may be formed by application method such as a dip coating method or a spin coating method using liquid solution of the organic luminescent material or liquid solution of the organic luminescent material and appropriate resin.

In the case where the organic luminescent layer is formed by vapor deposition, the thickness thereof may be in a range from about 1 nm to about 200 nm. If the organic luminescent layer is formed by application, the thickness may be in a range from about 5 nm to about 500 nm.

As the thickness of the organic luminescent layer increases, the voltage applied thereto for light emission must be increased, and therefore the luminous efficiency lowers so that the organic electro-luminescence element is likely to deteriorate.

As the thickness of the organic luminescent layer decreases, the luminous efficiency increases, but the breakdown is likely to occur so that the lifetime of the organic electro-luminescence element becomes short. Accordingly, the thicknesses are determined in the foregoing ranges in view of the luminous efficiency and the lifetime of the element.

The organic luminescent layer may be formed of a single layer of the foregoing luminescent material, or may be formed of multiple layers for controlling the characteristics such as a color and an intensity of the emitted light. Two or more kinds of luminescent materials or substances may be mixed. Also, the foregoing organic luminescent material, the hole transport material or an electron transport material may be doped with the luminescent material (e.g., fluorescent dyes such as rubrene, coumarin, quinacridone and quinacridone derivatives).

The electron injection layer 4 is arranged on the organic luminescent layer 3.

The electron injection material providing a small work function of the electron injection layer itself is preferably employed, and may be selected from aluminum, indium, magnesium, calcium, titanium, yttrium, lithium, gadolinium, ytterbium, ruthenium, manganese and alloys of these metals.

The electron injection material may be selected from a halogenide of alkali metal or alkaline earth metal (e.g., fluoride), an organic metal salt containing alkali metal or alkaline earth metal as the metal, an organic metal complex containing alkali metal or alkaline earth metal as the metal.

Alkali metal or alkaline earth metal contained in above halogenide, the organic metal salt or the organic metal complex may be lithium, beryllium, sodium, magnesium, potassium, calcium, rubidium, barium, strontium or cesium. In particular, lithium, magnesium, potassium, calcium and cesium are preferable because of good electron injection ability.

The metal oxide, metal fluoride, organic metal salt and organic metal complex of these metal may be used.

The above organic metal salt or organic metal complex may be selected from acetylacetonate complex, ethylenediamine complex, glycine complex, alpha-nitroso-beta-naphthol complex, salicylic acid salt, salicylaldoxime complex, cupferron complex, benzoinoxime complex, bipyridine complex, phenanthroline complex, crown complex, proline complex, benzoylacetone complex, dicarboxylic acid salt and aliphatic carboxylic acid salt containing the above metal.

Among them, acetylacetonate complex, salicylic acid salt, salicylaldoxime complex, dicarboxylic acid salt and aliphatic carboxylic acid salt containing the above metal are preferable because of good electron injection ability.

The halogenide of alkali metal or alkaline earth metal, the organic metal salt containing alkali metal or alkaline earth metal, and the organic metal complex containing alkali metal or alkaline earth metal are all chemically and physically stable substances. Accordingly, by employing the electron injection layer made of such a substance, the negative electrode can be easily formed on the electron injection layer. The negative electrode having transparency can be formed easily. Owing to presence of the electron injection layer made of such a substance, it is possible to fill an energy gap between the electron transport layer and the negative electrode, and the organic EL element can perform the light emission with a high brightness and a high luminous efficiency.

For providing the electron injection layer, the electron transport layer 6 may be formed on the organic luminescent layer 3, and the electron injection layer 4 may be formed on the electron transport layer 6, as is done in the display element shown in FIG. 3 and others.

The following may be employed as the electron transport material for forming the electron transport layer 6 and other electron transport layers which can be employed in the display element according to the invention.

Thus, nitro-substituted fluorenone derivative, anthraquinodimethane derivative, diphenoquinone derivative, thiopyrandioxide derivative, oxadiazole derivative, triazole derivative, thiadiazole derivative, coumarin derivative, chelated oxynoide compounds such as beryllium dibenzoxine and aluminum trisoxine may be employed.

Among them, the chelated oxynoide compound is particularly preferable in view of the heat resistance.

The electron transport layer may be formed by vapor deposition of the electron transport material, or may be formed by application method such as a dip coating method or a spin coating method using liquid solution of the electron transport material or liquid solution of the electron transport material and appropriate resin.

In the case where the electron transport layer is formed by vapor deposition, the thickness thereof may be in a range from about 1 nm to about 500 nm. If the electron transport layer is formed by application, the thickness may be in a range from about 5 nm to about 1000 nm. If the thickness exceeds the above range, the voltage to be applied for light emission with a predetermined brightness must be increased so that the luminous efficiency lowers and the organic electro-luminescence element is likely to deteriorate. If the thickness lowers above range, the luminous efficiency increases, but the breakdown is likely to occur so that the lifetime of the element becomes short.

The electron injection layer may be formed by a known vapor deposition method such as a usual resistance heating method, a sputtering method, an EB deposition method, an ion plating method or an ionizing vapor deposition method. In the case where the vapor deposition is employed, the thickness of the electron injection layer may be in a range from about 0.1 nm to about 20 nm. As the thickness of the electron injection layer increases, the voltage to be applied for light emission must be increased so that the luminous efficiency lowers and deterioration of the organic electro-luminescence element is likely to occur. As the thickness decreases, uniform deposition becomes difficult so that defects are likely to occur, and the luminous efficiency lowers. Accordingly, the lifetime of the organic electro-luminescence element becomes short. In view of the above, the thickness is determined within the foregoing range.

Then, the negative electrode 5 already described is formed on the electron injection layer 4.

Each of the positive and negative electrodes is connected directly (or via the lead portion for power supply described above) to an appropriate lead line 10 formed of, e.g., a nichrome, gold, copper or platinum wire, and the power source PW applies the predetermined voltage across the electrodes so that the organic EL element emit the light.

For the elements which have structures different from the above and are shown in FIGS. 1 to 5 and 7 to 9, the organic electro-luminescence element can be formed by successively forming the respective layers in the same manner as the above. In contrast to the above, the organic electro-luminescence element may be formed in such a manner that the negative electrode is first formed on the transparent substrate, the other layers including the organic luminescent layer are successively formed thereon, and the positive electrode is finally formed.

In the case where the organic electro-luminescence element includes the luminescent layer held between the two electric charge transport layers as shown in FIG. 7, the materials of the charge transport layers are selected from the hole transport material or electron transport material described above in accordance with the characteristics of the luminescent layer, and the charge transport layer can be formed in the manner similarly to the hole transport layer or electron transport layer described above. Preferably, the luminescent layer may be formed of a multi-layer structure such as a three-layer structure, in which respective layers are doped with different kinds of fluorescent dye.

In the case where the organic electro-luminescence element has the two organic luminescent layers with the blocking layer therebetween, the material of the blocking layer is selected from the hole transport material and electron transport material described above in accordance with the characteristics of the luminescent layer, and the blocking layer can be formed in the manner similarly to the hole transport layer or electron transport layer so that the blocking layer may block the transportation of the holes or electrons.

The organic EL elements described above can be applied to the various kinds of display devices and others in a wide range. For example, the organic EL element can be applied to a display for in-finder of a camera, a microscope, a telescope or the like. Also, it can be applied to a display on a glass of a watch or a clock, a display or illumination device internally arranged in a window pane or another transparent plate, e.g., of a glass tank, a display for a window, e.g., of an automobile or a train, a display internally arranged in a door mirror or a rearview mirror of a vehicle, an overlay display to be overlaid with another display screen, a display internally arranged in a trace tablet and a fluorescent display toy.

Any one of the organic EL elements described above may be configured to allow simple matrix drive. More specifically, each of the negative and positive electrodes is formed of a plurality of parallel strips, which are perpendicular to strips of the other electrode. This simplifies the structure of the drive portion, and can improve the transparency of the organic EL element.

In any one of the organic EL elements, the thickness from the positive electrode to the negative electrode (i.e., the thickness including the thicknesses of the positive and negative electrodes) is preferably in a range from 200 nm to 2000 nm for preventing the breakdown and other disadvantages of the element, for ensuring the transparency and for lowering the required drive voltage. The portion located between the positive and negative electrodes preferably has the thickness in a range from 20 nm to 200 nm.

In the case where the organic EL element entirely has the transparency, it is practically preferable that the portion of the organic EL element used for display and viewing has a visible light transmittance of 70% or more, which can be achieved, e.g., by adjusting the transparency of each layer. This light transmittance is more preferably 80% or more. This allows clear display of the underlying transparent image even when the organic EL element is overlaid, e.g., on another display element or display device.

Then, description will be given on a camera, which is an example of an optical device provided with the finder screen display device of the invention.

Figure 10:
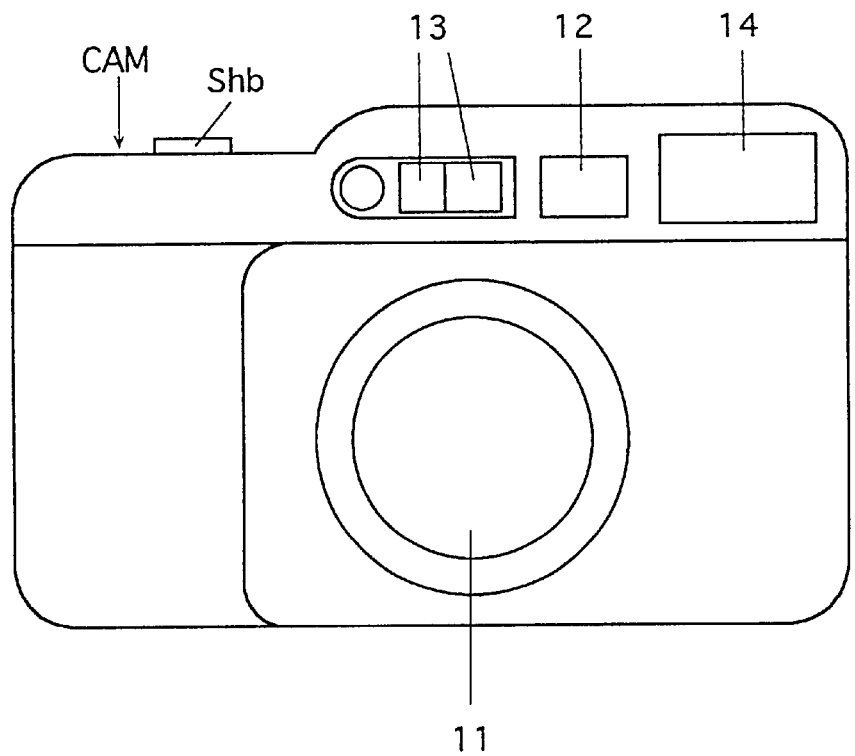
FIG. 10 is an elevation of a camera provided with a finder screen display device according to the invention.
Figure 11:
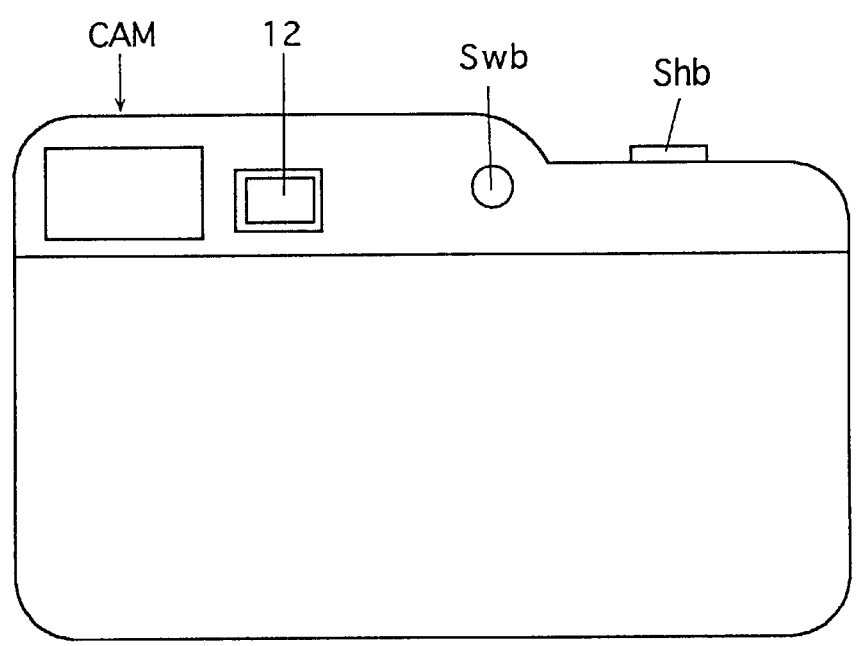
FIG. 11 is a rear view of the camera shown in FIG. 10.

FIG. 10 is an elevation of a camera provided with the finder screen display device of the invention (i.e., the finder screen display device including the organic electro-luminescence element as the display device). FIG. 11 is a rear view of the camera.

A camera CAM shown in FIGS. 10 and 11 is provided with a shooting optical system 11 and a finder optical system 12 which are independent of each other, and is also provided with a distance measuring optical system 13, a flash 14, a shutter button Shb and an autofocus area switching button Swb for switching an autofocus area.

Figure 15:
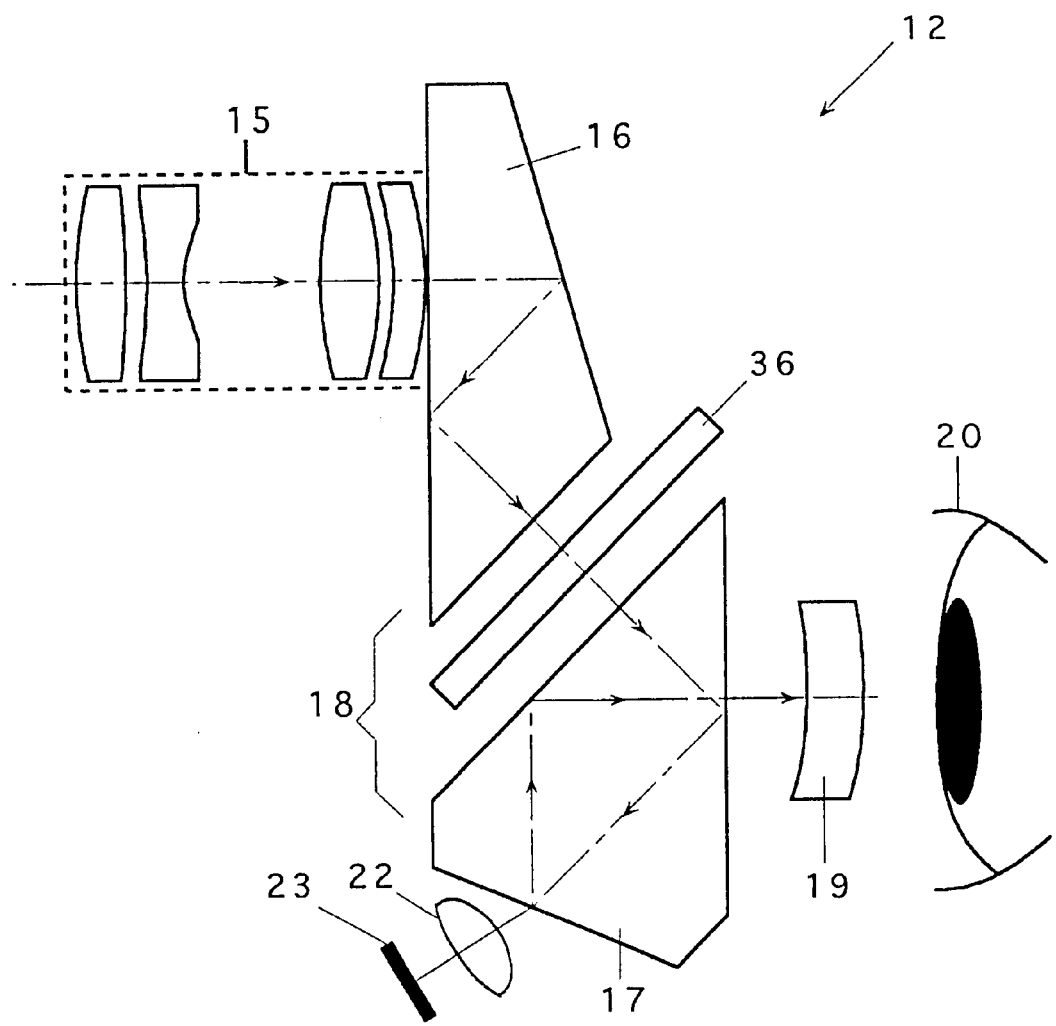
FIG. 15 is a plan showing a finder optical system of the camera shown in FIG. 10.

FIG. 15 is a plan showing only the finder optical system 12 in the camera CAM shown in FIG. 10. The finder optical system 12 is formed of an object optical system 15 formed of an object lens group, a reverse optical system 18 formed of a Dachkant prism (roof prism) 16 and a pentagonal prism 17, and an eye-piece lens 19. The light beams coming from the subject are converged by the object optical system 15, are directed and vertically inverted by the Dachkant prism 16, and form an image at the vicinity of the pentagonal prism 17.

The imaging surface determined by the object optical system 15 slightly moves along the optical axis in accordance with the shooting distance which is determined as the distance to the subject.

In FIG. 15, a reference number 20 indicates an eye of a camera user, 36 indicate an organic electro-luminescence element, 22 indicates a photometer lens and 23 indicates a photometer element.

Figure 12:
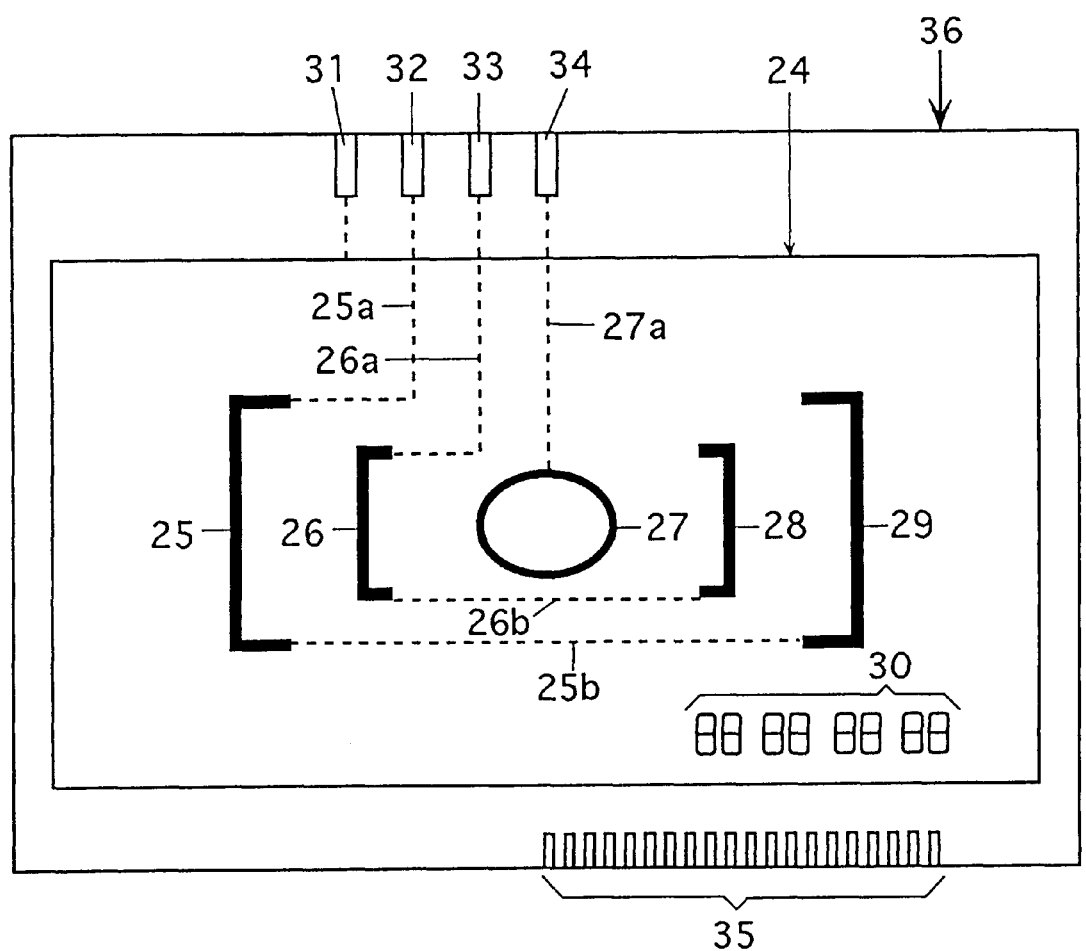
FIG. 12 shows an organic electro-luminescence element in a finder screen display device of the invention mounted in the camera shown in FIG. 10.

FIG. 12 shows an example of an organic electro-luminescence element (organic EL element) employed in the finder screen display device mounted in the camera CAM.

In the finder, the user can view only a range of a finder screen 24 shown in FIG. 12. The organic electro-luminescence element 36 has various portions within the view frame (finder screen 24), and more specifically has display portions 26 and 28 of a standard autofocus area frame, display portions 25 and 29 of a wide autofocus area frame, parallax correction mark 27, and 7-segment display portion 30. The date, time, number of taken exposures, shooting conditions and others are displayed on 7-segement display portion 30.

The outer side of the view frame (finder screen) 24 of the organic electro-luminescence element 36 is sealed by a sealing material such as adhesive, and the display portions in the display element are electrically connected a positive electrode connector 31, negative electrode connectors 32, 33 and 34, and a 7-segment connector 35 via patterned transparent electrodes.

Dotted lines in FIG. 12 represent a manner in which respective luminescent portions 25, 26 and 27 are connected to negative electrode connectors 32, 33 and 34 via transparent electrodes 25a, 26a and 27a, and also represent a manner of connections between luminescent portions 25 and 29 via a transparent electrode 25b and between luminescent portions 26 and 28 via a transparent electrode 26b.

Figure 13:
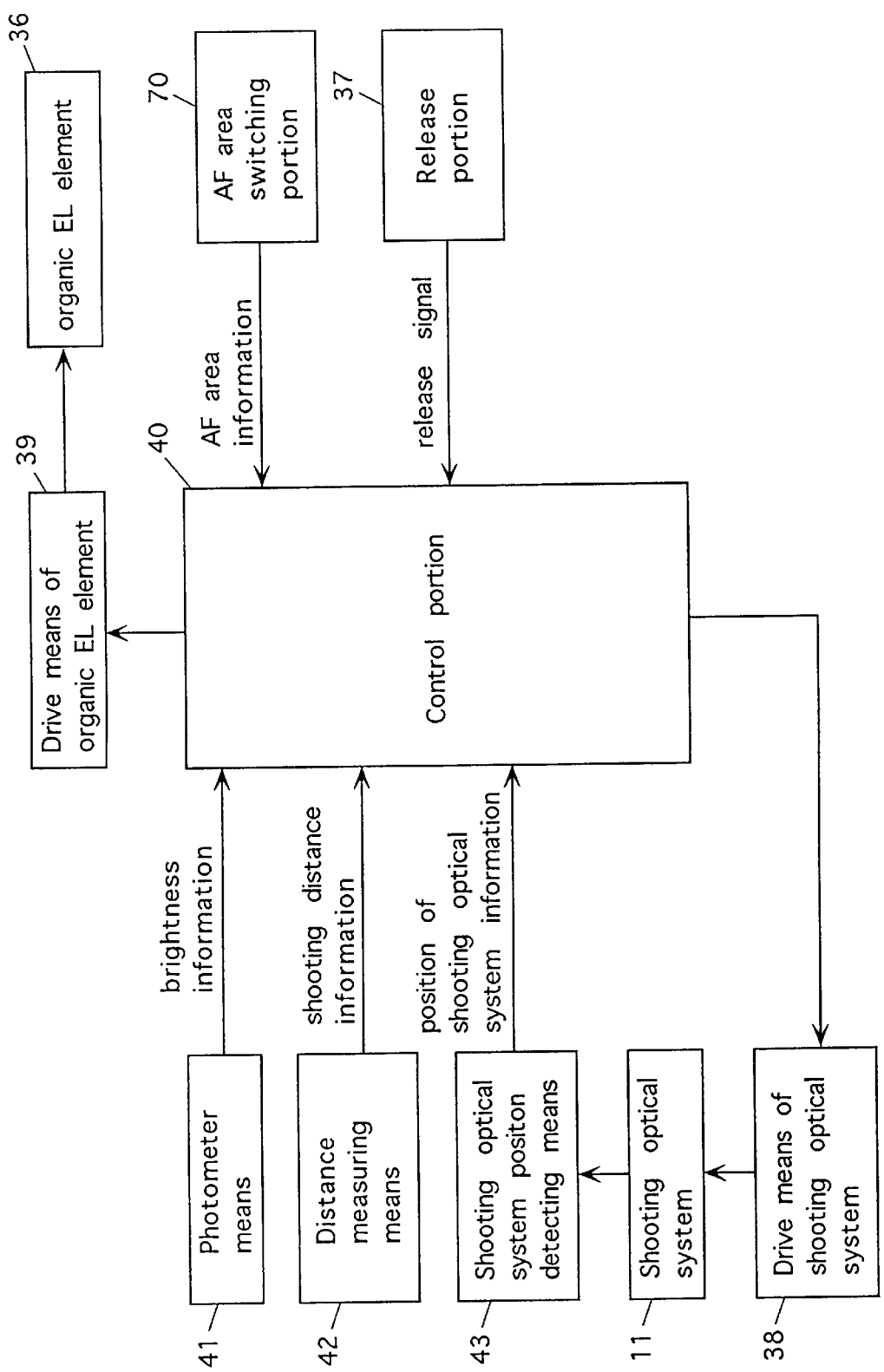
FIG. 13 is a block diagram showing a control circuit of the camera shown in FIG. 10.

These display portions (luminescent portions) are electrically connected to organic electro-luminescence element drive means 39 (see FIG. 13).

The display portions 26 and 28 of the standard AF area frame, the display portions 25 and 29 of the wide AF area frame, and the parallax correction mark 27 are statically driven independently of each other, and the 7-segment display portion 30 is also driven statically.

The transparent or opaque electrodes are used as the negative electrodes of luminescent portions 25, 26, 27, 28, 29 and 30 of the organic electro-luminescence element 36. However, the portions located beyond them and in the effective view area (finder screen) 24 are connected to the respective connectors via the transparent electrodes, respectively.

Each luminescent display portion can emit the light when the voltage is applied across;the positive and negative electrodes.

In this finder display device, the display portion itself of the element 36 emits the light so that the structure does not require an illumination mechanism for externally illuminating the frame display and a projection mechanism for display projection, and therefore can have a simple structure. Further, a position control operation of the illumination mechanism is not required.

FIG. 13 is a block diagram showing a circuit for whole operation control of the camera CAM equipped with the finder screen display device described above. The control portion 40 receives information which relates to the brightness of the subject in the scope corresponding to the finder screen 24, and is sent from the photometer means 41 formed of the photometer element and others. The control portion 40 also receives information which relates to the shooting distance and is sent from distance measuring means 42 including the distance measuring optical system, information which relates to the position of the shooting optical system 11 and is sent from shooting optical system position detecting means 43, information which relates to the autofocus area and is sent from an autofocus area switching portion 70 provided with the AF area switching button, and a signal of releasing sent from a release portion 37 provided with the shutter button.

The controller 40 controls the shooting optical system drive means 38 and the drive means 39 of the organic electro-luminescence display element (organic EL element) 36 based on the received informations and signal. In this case, the position of the shooting optical system 11 is feedback-controlled by using the shooting optical system drive means 38 and the shooting optical system position detection means 43 to achieve proper focusing in accordance with the shooting distance obtained on the basis of the information sent from the distance measuring means 42. The organic electro-luminescence display element 36 is controlled to be turned on, turned off and blink via the display element drive means 39.

Figure 14:
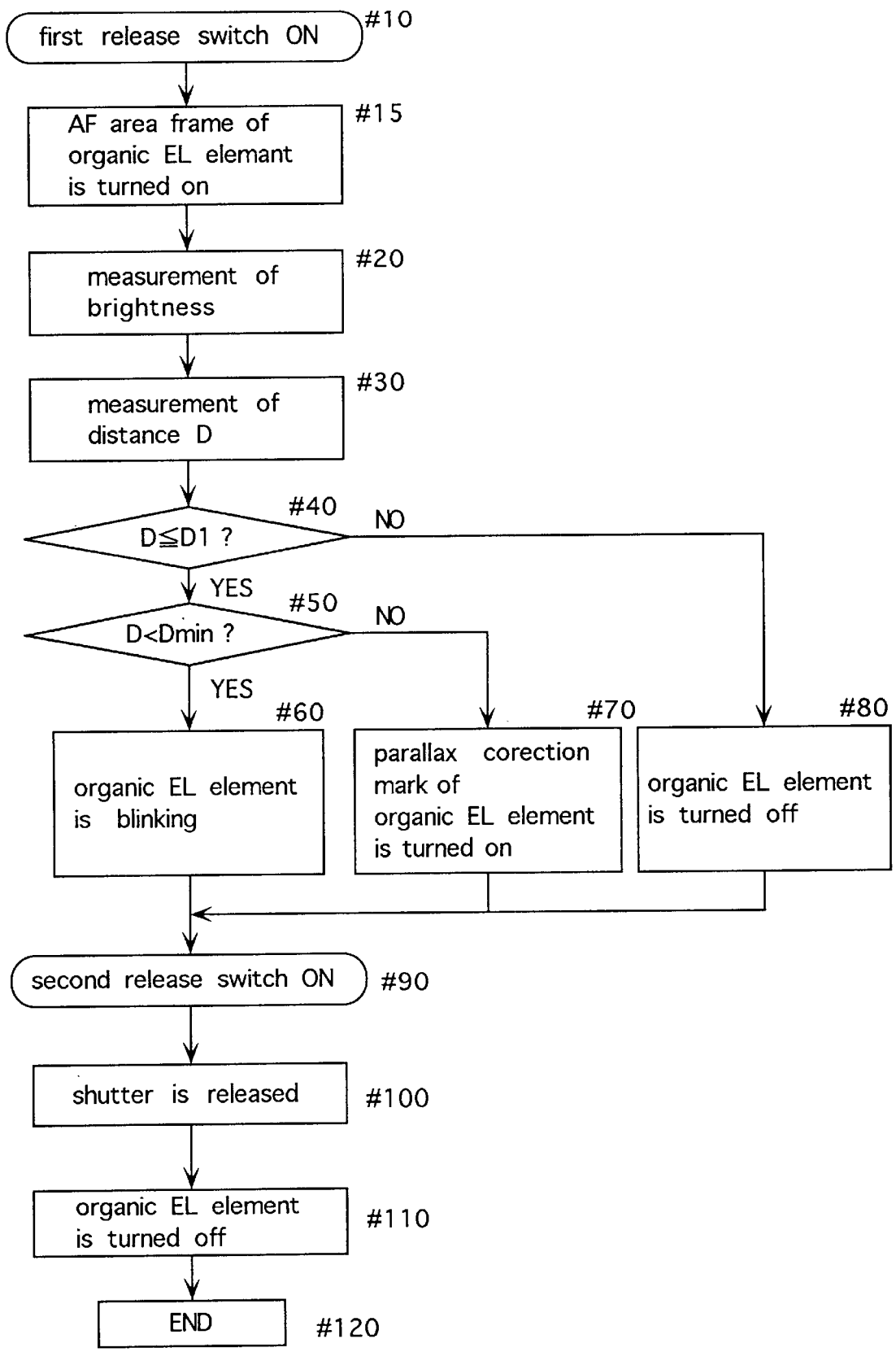
FIG. 14 is a flowchart showing control for turn-on, blinking and turn-off of an organic electro-luminescence element by a control portion in a control circuit shown in FIG. 13.

FIG. 14 is a flowchart showing the manner of turn-on, turn-off and blinking of the organic electro-luminescence display element 36 in accordance with the instruction of the control portion 40. First, the user touches or partially presses the shutter button in a step #10 so that the first release switch is turned on. Thereby, the AF area frame corresponding to the AF area which is currently selected is turned on. Thus, the display portions 26 and 28 are turned on when the standard AF area is selected. When the wide AF area is selected, the display portions 25 and 29 are turned on. In a step #20, the control portion 40 controls the photometer means 41 to measure the brightness of the subject in the corresponding area on the finder screen 24 (i.e., to perform the photometric operation), and the distance measuring means 42 measures the shooting distance D (i.e., performs the distance measurement) in a step #30. When it is determined in a subsequent step #40 that the shooting distance D is larger than a distance D1 requiring the parallax correction, the operation advances to a step #80 to turn off the organic electro-luminescence display element 36. If it is determined that the shooting distance D is equal to or smaller than the distance D1, the operation advances to a step #50.

If it is determined in the step #50 that the shooting distance D is shorter than the allowed minimum shooting distance Dmin which can achieve focus, the operation advances to a step #60 to blink the display portions 26 and 28, or display portions 25 and 27 of the organic electro-luminescence element for calling attention of the user. When the shooting distance D is equal to or larger than the allowed minimum shooting distance Dmin, the operation moves to a step #70. Thereby, the display portion 27 of the organic electro-luminescence element in the substantially central position of a shooting region 53 (see FIG. 30) on the finder screen 24 is turned on to represent the fact that the parallax correction is required.

When the operation advances to the step #60, #70 or #80, the user fully presses the shutter button to turn on the second release switch in a step #90. Thereby, the shutter is released to perform the shooting in a step #100. In a step #110, the organic electro-luminescence element is turned off, and the final step ends in a step #120. When the user stops partial pressing of the shutter button after the operation entered the step #60, #70 or #80, the organic electro-luminescence element 36 is turned off, and the device enters the standby state.

As described above, if the parallax correction is not required, the organic electro-luminescence display element 36 is turned off to become transparent so that the parallax correction mark does not obstruct the view in contrast to the conventional structure in which the parallax correction mark is always displayed on the finder screen 24.

For the actual shooting, an intended scope is determined on the finder screen 24. Then, the shutter button is partially pressed so that the distance measuring optical system 13 (see FIG. 10) provided in the camera body measures the shooting distance to the subject (shooting target) within in a region surrounded by AF frames 26 and 28 or frames 25 and 29 provided in the central region of the finder screen 24. Based on the shooting distance thus measured, the shooting optical system 11 is automatically controlled to achieve the focus.

In the above operation, the shooting distance may be shorter than a predetermined distance so that the parallax correction may be required. In this case, the display portion 27 in the organic electro-luminescence element is turned on. Only when the display portion 27 in the organic electro-luminescence element is turned on, the user stops partial pressing of the shutter button, and changes the relative position of the camera to the shooting target by changing the direction of the camera and/or the distance to the shooting target so that the display portion 27 will be kept on off-state when the shutter button is partially pressed again. Thereafter, the shutter button is fully pressed so that the shooting can be performed accurately regardless of whether the parallax correction is required or not.

Accordingly, this shooting method is simple in contrast to the conventional method in which the shooting scope is confirmed by alternately viewing the parallax correction marks in the vertical and horizontal directions.

Then, description will be given on a camera provided with another example of finder screen display device of the invention.

Figure 16A:
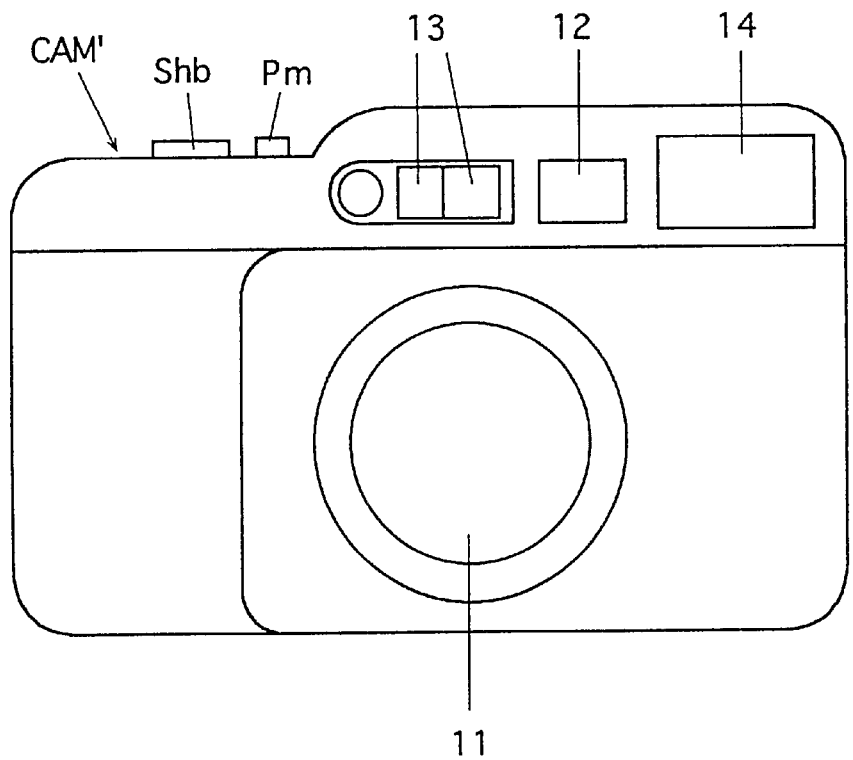
FIG. 16(A) is an elevation of another example of a camera provided with a finder screen display device according to the invention.
Figure 16B:
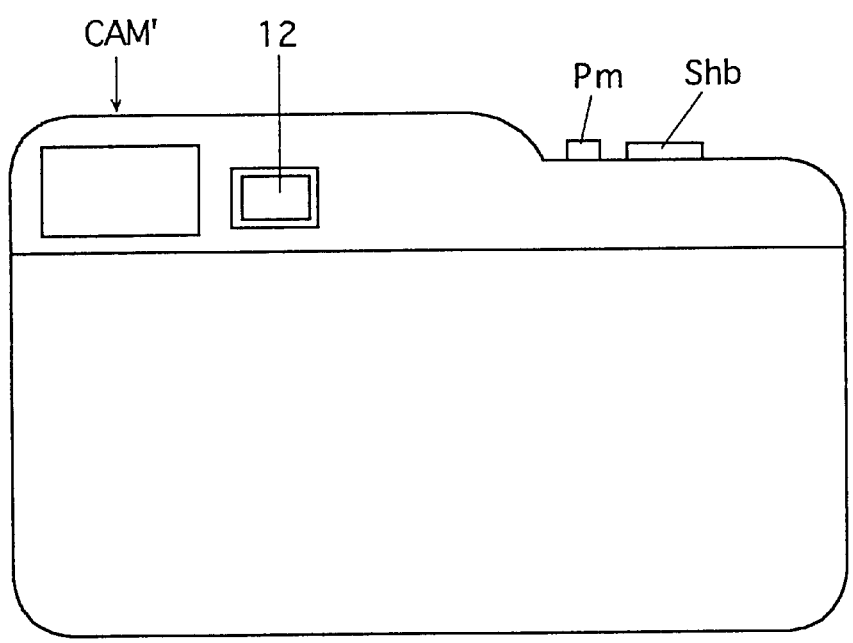
FIG. 16(B) is a rear view of the same.

FIG. 16(A) is an elevation of the camera provided with the finder screen display device of the invention, and FIG. 16(B) is a rear view of the camera. A camera CAM' shown in FIG. 16 is provided with a shooting mode select switch Pm for switching between the standard shooting mode and the macro shooting mode. Structures other than the above are the same as those of the camera shown in FIGS. 10 and 11.

Figure 17:
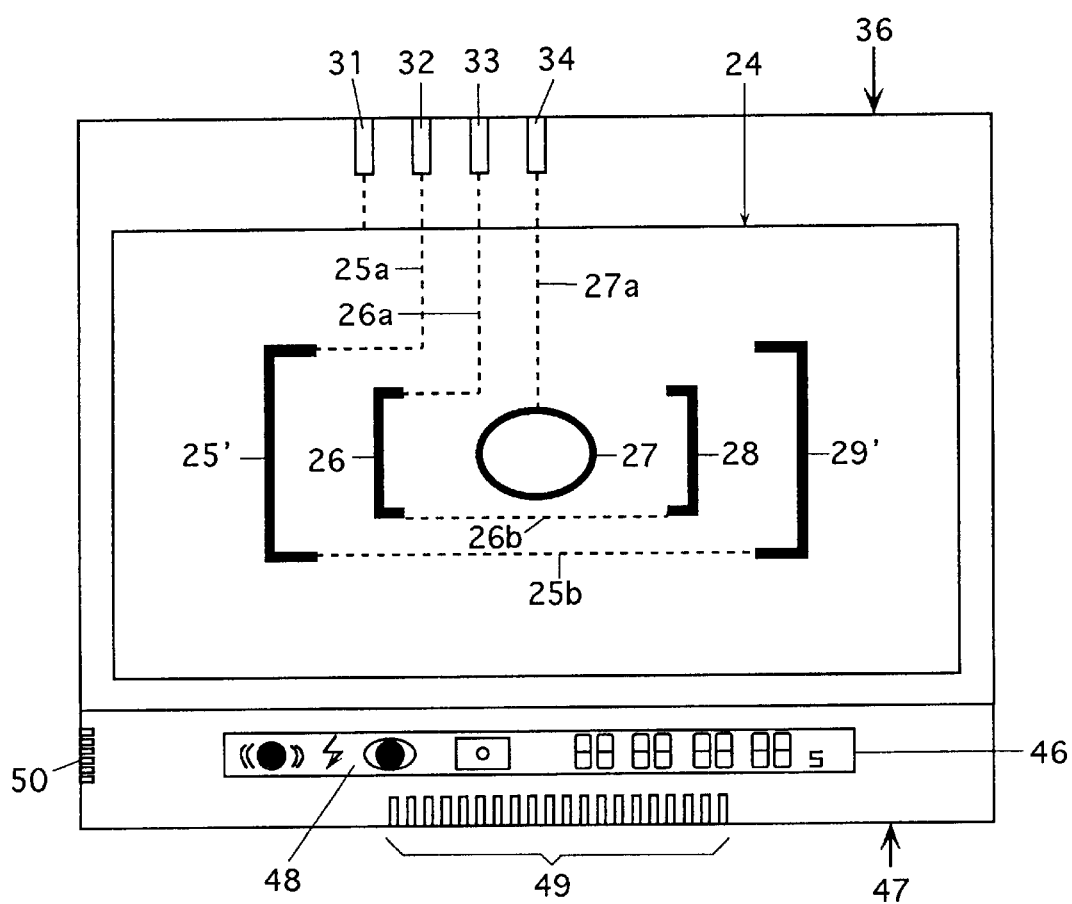
FIG. 17 shows an organic electro-luminescence element and a liquid crystal display element in a finder screen display device of the invention mounted in the camera shown in FIGS. 16(A) and 16(B)

FIG. 17 shows a finder screen display device of the invention. This finder screen display device is formed of the two display element portions, i.e., the organic electro-luminescence display element portion 36 and a liquid crystal display element portion 47.

In the finder, the user can view a scope of the effective view area 24 including the view frame as well as the opaque liquid crystal display element portion 46 outside the view frame. Among the portions and mark of the organic electro-luminescence display element 36, the display portions 26 and 28 of the standard AF area frame, display portions 25' and 29' of the macro AF area frame, and the parallax correction mark 27 are displayed within the view frame.

The outer side of the view frame (finder screen) 24 of the organic electro-luminescence display element 36 is closed by a sealing material such as adhesive, and the respective display portions of the display element are electrically connected to the positive electrode connector 31 and the negative electrode connectors 32, 33 and 34 via patterned transparent electrodes. Dotted lines in FIG. 17 represent a manner in which respective luminescent portions 25', 26' and 27' are connected to the negative electrode connectors 32, 33 and 34 via transparent electrodes 25a, 26a and 27a, and also represent manners of connections between luminescent portions 25' and 29' via the transparent electrode 25b and between the luminescent portions 26 and 28 via the transparent electrode 26b.

Figure 18:
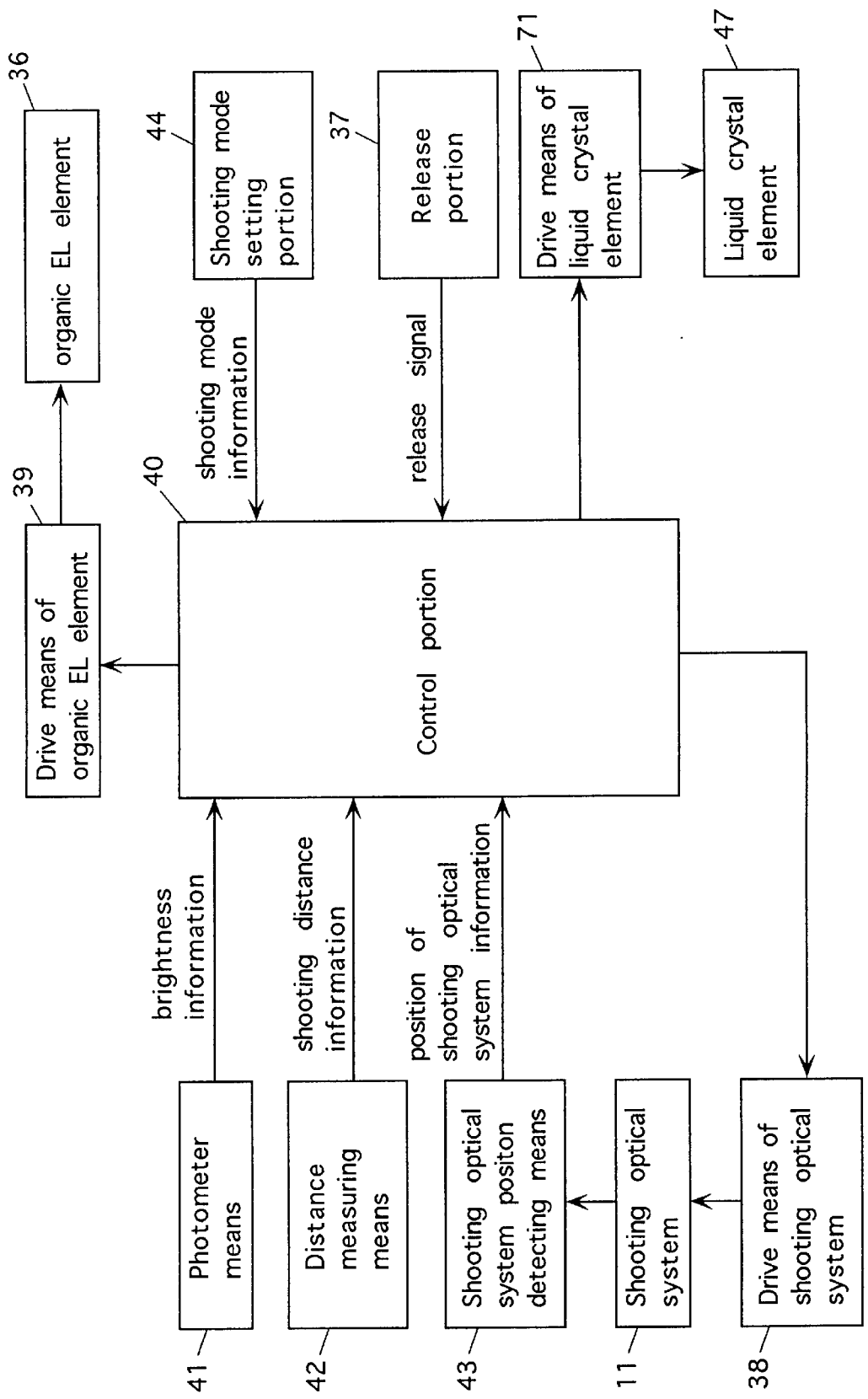
FIG. 18 is a block diagram showing a control circuit of the camera shown in FIGS. 16(A) and 16(B)

FIG. 18 is a block diagram showing a circuit for control of the whole operation of the camera CAM'. As shown in FIG. 18, the control system of the camera CAM' is the same as that of the camera shown in FIG. 13 except that the information relating to the shooting mode is supplied from a shooting mode setting portion 44 provided with the shooting mode select switch, instead of the AF area switching portion, and that the control portion 40 controls drive means 71 of the liquid crystal display element 47 based on the information and signal supplied to the control portion 40.

The respective luminescent portions (display portions) shown in FIG. 17 are likewise connected electrically to the organic electro-luminescence display element drive means 39.

The display portions 26 and 28 of the standard AF area frame, the display portions 25' and 29' of the macro AF area frame, and the parallax correction mark 27 are driven independently of each other.

Transparent or opaque electrodes are used as the negative electrodes of the luminescent portions 25', 26, 27, 28 and 29' in the organic electro-luminescence element 36. However, the portions located beyond them and inside the effective field area (finder screen) 24 are connected to the respective connectors via transparent electrodes.

By receiving a voltage across the positive and negative electrodes, each luminescent display portion can emit the light.

Each luminescent display portion is connected to a drive circuit (not shown), and is driven in a static manner.

A liquid crystal display element of a usual backlight type is used in the LCD element portion 47, and an LCD panel of a TN type or an STN type or a color LCD panel of TFT is used as the LCD panel of the above LCD element portion 47. The LCD panel includes an icon display portion for display icons representing the AF mode, flash mode and others as well as a matrix display portion displaying a date, a time, number of taken exposures, shooting conditions and others.

Each display portion in the LCD element portion is connected to electrode connectors 49 and 50 via transparent electrodes, and thereby is electrically connected to the LCD element drive means for the simple matrix drive, although not shown.

FIG. 19 is a flowchart showing a manner of controlling turn-on, turn-off and blinking of the organic electro-luminescence element in this embodiment. When the macro shooting mode for proximity shooting is selected, a shooting range 53 (see FIG. 30) in the finder screen 24 shifts to a large extent, and therefore the parallax correction is required. This embodiment is configured to display the position of the shooting range 53 in the finder screen 24 when the parallax correction is required as described above.

In FIG. 19, steps #210–#230 are the same as the steps #10–#30 in the flowchart of FIG. 14. In the AF area frame, however, the display portion 25' and 29' are turned on during the macro shooting mode, and the display portions 26 and 28 are turned on during the standard shooting mode. In this embodiment, if it is determined in a step #240 after the photometric and distance measurements that the macro shooting mode is selected, the operation advances to a step #250. If not, the operation advances to a step #260.

When the operation advances to the step #250, it may be determined that the shooting distance D and is equal to or larger than the minimum shooting distance Dmin1, corresponds to the macro shooting mode, allowing proper focusing. In this case, the operation advances to a step #270, and the display portion 27 which is located substantially in the center of the shooting region 53 within the finder screen 24 is turned on to display the fact that the parallax correction is required. When it is determined in the step #250 that the shooting distance D is shorter than the allowed minimum shooting distance Dmin1, the operation advances to a step #280 to blink the display portion 27 for calling attention of the user.

When the operation advances to a step #260, it may be determined that the shooting distance D is equal to or larger than a minimum shooting distance Dmin2 allowing proper focusing in the standard shooting mode other than the macro shooting mode. In this case, the parallax correction is not required. Therefore, the operation advances to a step #290, and the organic electro-luminescence element 36 is turned off for allowing shooting without the parallax correction. If the shooting distance D is shorter than the minimum shooting distance Dmin2, the operation advances to a step #280 to cause blinking of the display portion 27 for calling attention of the user.

After the step #270, #280 or #290, the operation enters a step #300, and the operation between the steps #300 and #330 will be performed in a manner similar to that in the steps #90–#120 shown in FIG. 14. The actual shooting manner using the finder screen display device shown in FIG. 17 is similar to that of the device shown in FIG. 12. When the display portion 27 of the organic electro-luminescence display element 36 is turned on, the user temporarily stops the partial pressing of the shutter button, and will perform the shooting after changing the relative position between the shooting target and the camera to keep the display portion 27 off even when the shutter button is partially pressed.

As the structures of the finder screen display devices according to the invention, description has been given on the structures in which the position of the shooting range on the finder screen is displayed for correcting the parallax occurring in accordance with the shooting distance or shooting mode. The invention is not restricted to this. For example, such a structure may be employed that a warning is given to the user by turning on or blinking the organic electro-luminescence element when a required exposure which changes in accordance with the brightness of the shooting target is shifted from the predetermined relative range (i.e., when an appropriate exposure corresponding to the brightness of the shooting target is not obtained even when the shutter speed and/or the iris are changed to the variable limits). Such a structure may also be employed that film loading error, if occurred, is informed to the user by turning on or blinking the organic electro-luminescence element.

In these cases, the forms, colors and/or positions of the display portions of the organic electro-luminescence element may be variable in accordance with the kinds of information to be transmitted to the user, whereby many items of information can be simultaneously informed without misunderstanding.

Figure 29A:
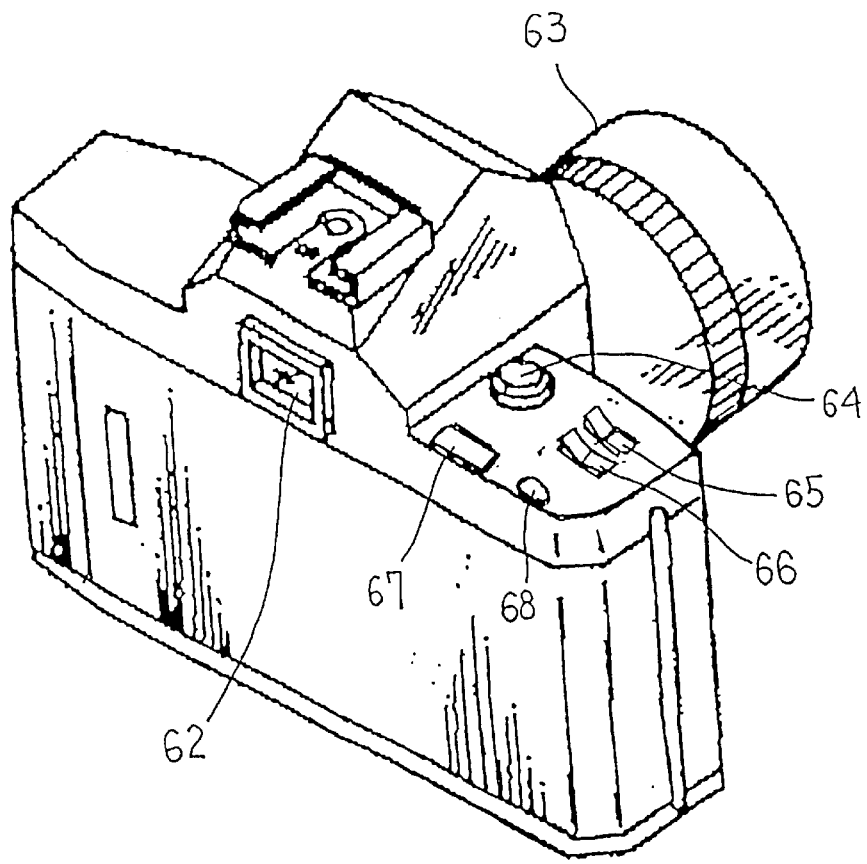
FIG. 29(A) is a perspective view of a single-lens reflex camera provided with a finder screen display device according to the invention.

As an example of the above, description will be given on the finder screen display device according to the invention, which is mounted in a single-lens reflex camera. In FIG. 29(A), 62 indicates a finder, 63 indicates a shooting lens, 64 indicates a shutter button, 65 indicates a shutter speed control key, 66 indicates an iris control key, 67 indicates a main switch also serving as a shooting mode select switch, and 68 indicate an AF area select key.

Figure 29B:
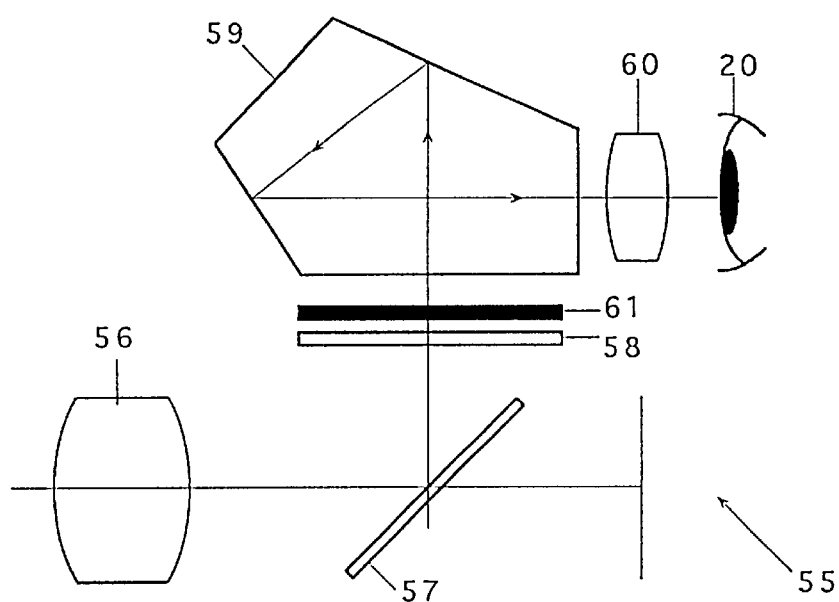
FIG. 29(B) shows a finder optical system in the camera.

FIG. 29(B) represents the position of the organic electro-luminescence element in the camera in FIG. 29(A) together with the finder optical system 55 of the camera. In FIG. 29(B), 20 indicates the eye of the camera user, 56 indicates a shooting lens, 57 indicates a quick return mirror, 58 indicates a focus plate, 59 indicates a pentagonal prism, 60 indicates an eye-piece lens, and 61 indicates an organic electro-luminescence element forming the finder screen display device. As shown in FIG. 29(B), the organic electro-luminescence element 61 is disposed in the light path near the image formation position of the image of the shooting target viewed through a finder 62.

The finder screen display device according to the invention may be applied to various optical devices equipped with finders, and more specifically a video camera, a digital camera, a telescope, binoculars, a microscope and others.

Then, description will be given on examples of method of manufacturing the organic electro-luminescence element which is employed in the finder screen display device described above.

Example 1 of Manufacturing of Organic Electro-Luminescence Element

A metal mask is set on a transparent glass substrate 100. This metal mask has a cut pattern corresponding to the configuration of the positive electrode and the power supply lead portion to be connected to the positive electrode. Sputtering of an ITO sintered target (containing $In_2O_3$ and 10 wt % of $SnO_2$) is performed by a sputtering device so that an electrically conductive ITO film having a thickness of 50 nm is formed through the above metal mask on the substrate. Thereby, a positive electrode 101a, positive electrodes 101b on the left and right sides thereof and positive electrodes 101c on the left and right sides of the electrodes 101b as well as the lead portion 101' are formed.

Then, the substrate is moved to a vacuum vapor deposition device, and a metal mask provided with a square opening having an area covering the whole positive electrodes is placed on the ITO film. As the hole injection layer, 4,4',4"-tris [N,N',N"-triphenyl-N,N',N"-tris(3-methylphenyl)]triaminotriphenylamine is deposited by the vacuum deposition method to form a thin film of 15 nm in thickness.

With the same metal mask, N,N'-diphenyl-N,N'-bis(1-naphthyl)-1,1'-diphenyl-4,4'-diamine is deposited as the hole transport layer on the hole injection layer so that a thin film of 55 nm in thickness is formed.

Figure 20A:
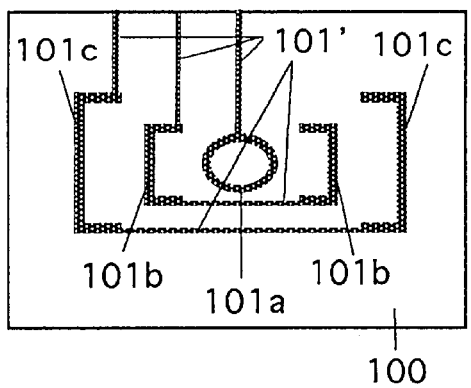
FIGS. 20(A) to 20(G) show steps of manufacturing an example of an organic electro-luminescence element.
Figure 20E:
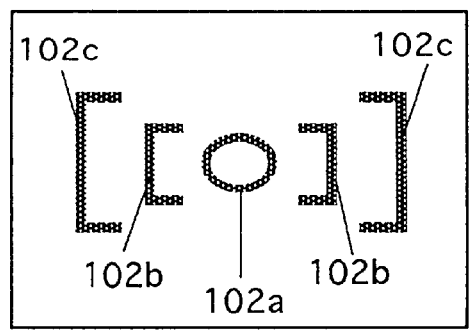
Figure 20B:
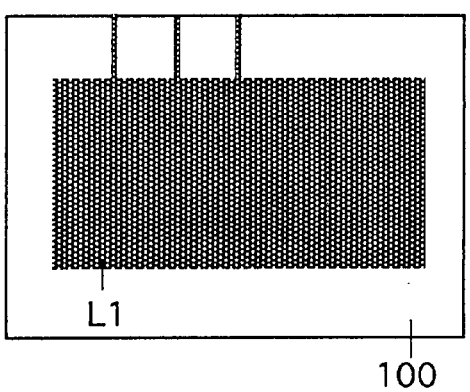
Figure 20F:
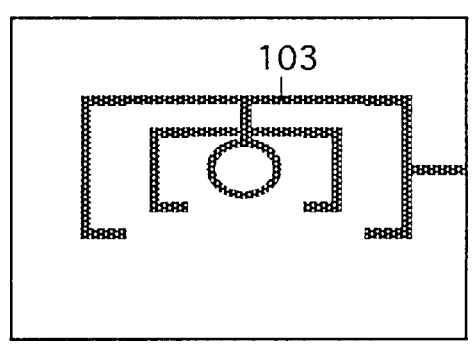

In this manner, a film L1 including the hole injection layer and the hole transport layer layered together is formed as shown in FIG. 20(B).

Figure 20C:
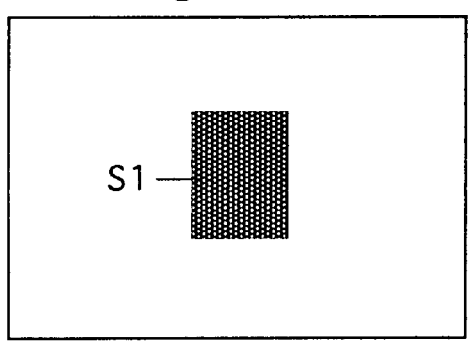

On the film L1, a metal mask is laid. This metal mask has a square opening located in a position and having an area covering the ellipsoid positive electrode 101a. Aluminum trisoxine doped with 5 wt % of rubrene is deposited by vapor deposition to form the organic luminescent layer so that a thin film S1 having a thickness of 20 nm and a pattern shown in FIG. 20(C) is formed.

The metal mask provided with a square opening having an area covering the whole positive electrode is set again, and aluminum trisoxine is vapor-deposited on the thin film S1 as the luminescent layer also serving as the electron transport layer. Thereby, a thin film S2 of a thickness 50 nm having a pattern shown in FIG. 20(D) is formed.

Then, the metal mask is exchanged with a new metal mask having a cut pattern corresponding to the configuration, which is corresponding to the configuration of the positive electrode, of the negative electrode, and magnesium and silver in an atomic ratio of 10:1 are vapor-deposited to form a film of a thickness of 50 Å so that negative electrodes 102a, 102b and 102c of the pattern shown in FIG. 20(E) are formed.

Over them, a metal mask having a cut pattern corresponding to the configuration of the lead portion for power supply to the negative electrode is set, and ITO is sputtered by a sputtering device to form a power supply lead portion also serving as the sealing layer. Thereby, the lead portion 103 which is formed of a thin film having a pattern shown in FIG. 20(F) and a thickness of 200 nm.

Figure 20G:
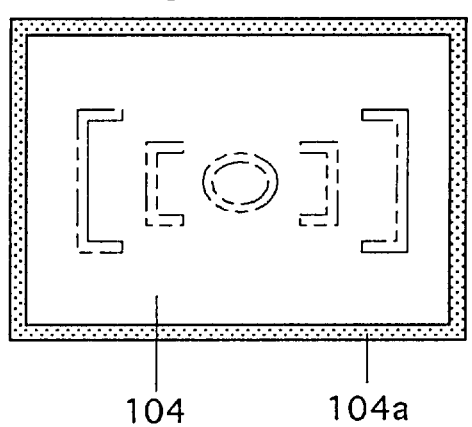
Figure 20D:
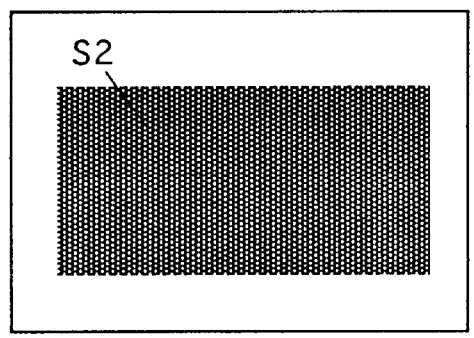

As shown in FIG. 20(G), a transparent glass substrate 104 having an end or edge portion coated with acrylic resin 104a for sealing is laid, and the resin is cured by irradiation with ultraviolet rays for sealing.

In this manner, the organic electro-luminescence element in which the whole display portion is transparent and can emit light in two colors is manufactured.

When a voltage of 8V or more is applied to this element, the AF area frame emits green light, and the parallax correction mark portion emits yellow light.

Example 2 of Manufacturing of Organic Electro-Luminescence Element

A substrate 100' which is a commercially available ITO-coated glass, in which ITO is about 150 nm in thickness, is prepared. A mask for screen printing which bears a pattern for the positive electrode and the power supply lead portion to be connected to the positive electrode is disposed on the substrate 100'. Resist is applied by screen printing and then is cured. Thereafter, the ITO portion not covered with the resist is etched with acid, and then the resist is dissolved. The resist thus used is a positive resist AZ-RFPA manufactured by Clariant Corp.

The substrate thus processed is rinsed with neutral soap and organic solvent, and the surface is cleaned with ultraviolet rays and ozone ($O_3$).

Figure 21A:
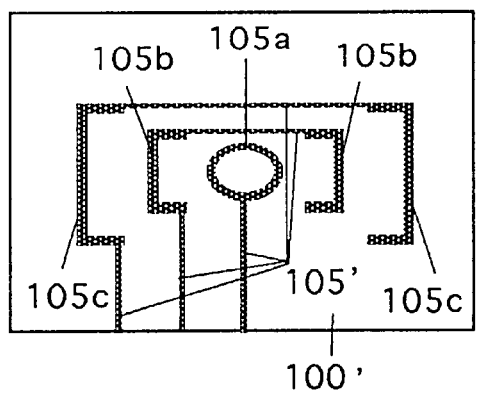
FIGS. 21(A) to 21(G) show steps of manufacturing another example of an organic electro-luminescence element.

Through the above steps, a positive electrode 105a, positive electrodes 105b on the left and right sides thereof and positive electrodes 105c on the left and right sides of the electrodes 105b as well as a lead portion 105' are formed as shown in FIG. 21(A).

Figure 21B:
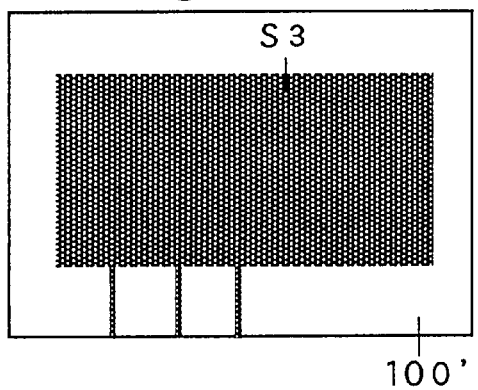

Then, the substrate is move to a vapor deposition device, and a metal mask provided with a square opening of an area covering the whole positive electrode is set on the positive electrode. Then, copper-phthalocyanine is vapor-deposited on the positive electrode as the hole injection layer. Thereby, a thin film S3 having a thickness of 10 nm and a pattern shown in FIG. 21(B) is formed.

Figure 21C:
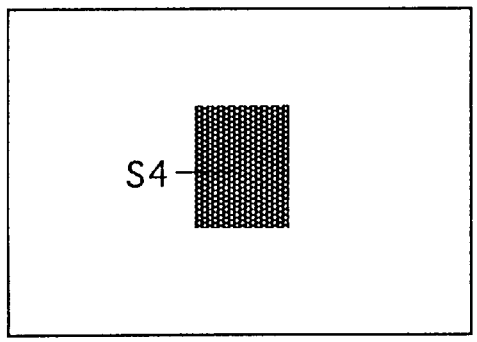

Then, a metal mask provided with a square opening of an area covering the positive electrode 105a is set, and N,N'-diphenyl-N,N'-bis(4-methylphenyl)-1,1-bis(3-methylphenyl)-4,4'-diamine doped with 5 wt % of rubrene is vapor-deposited as the luminescent layer on the hole injection layer S3. Thereby, a thin film S4 of 25 nm in thickness having a pattern shown in FIG. 21(C) is formed.

Figure 21D:
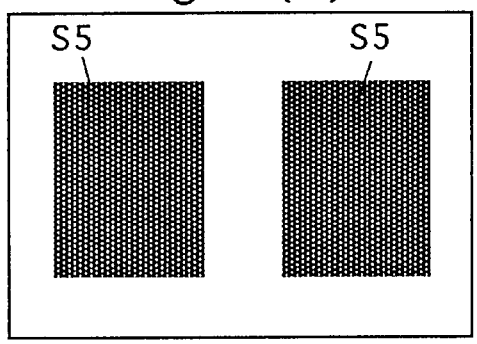

Then, a metal mask provided with a square opening of an area covering the positive electrodes 105b and 105c is set, and beryllium dibenzoxine doped with 0.5 wt % of quinacridone is vapor-deposited as another luminescent layer so that thin films S5 having a thickness of 25 nm and patterns shown in FIG. 21(D) are formed.

Figure 21E:
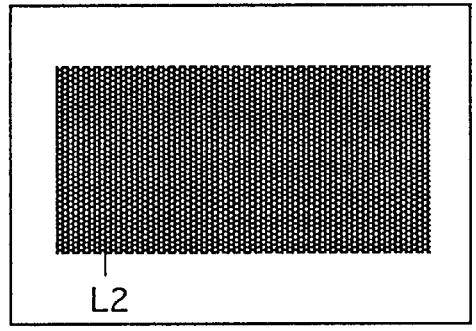

The metal mask provided with a square opening of an area covering the whole positive electrodes is set again, and beryllium dibenzoxine is vapor-deposited over the thin films S4 and S5 as the electron transport layer so that a thin film of 40 nm in thickness is formed. Further, with the same mask, potassium acetylacetonate complex is deposited by resistance heating vapor deposition to form a thin film of 2 nm in thickness. In this manner, a film L2 having the pattern shown in FIG. 21(E) and including the electron transport layer and the electron injection layer layered together is formed.

Figure 21F:
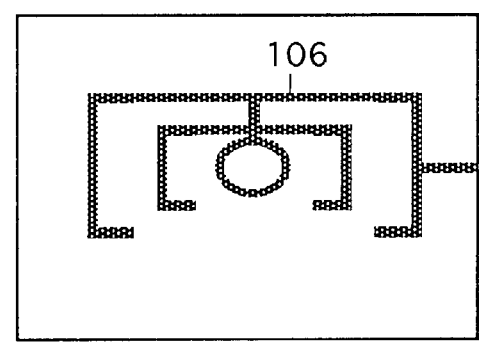

Thereafter, a mask having a cut pattern corresponding to the negative electrode and the power supply lead portion to be connected to the negative electrode is set, and sputtering of $In_2O_3$ doped with 5% of ZnO is performed by an RF sputtering device so that a thin film 106 of 180 nm in thickness having a pattern shown in FIG. 21(F) is formed.

Figure 21G:
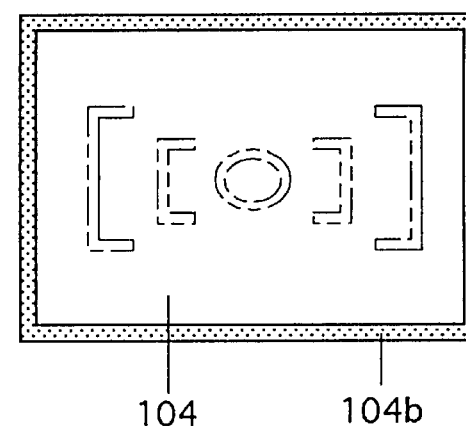

Above it, a glass substrate having an end portion coated with epoxy resin 104b for sealing is placed as shown in FIG. 21(G), and the resin is thermally cured to provide sealing.

In this manner, the organic electro-luminescence element in which the display portion is entirely transparent and can emit light in two colors is manufactured.

By applying a voltage of 15 V or more to this element, the AF area frame emits green light, and parallax correction mark portion emits yellow light.

Example 3 of Manufacturing of Organic Electro-Luminescence Element

The substrate 100' which is a commercially available ITO-coated glass, in which ITO is about 150 nm in thickness, is prepared. A mask for screen printing which bears a pattern for the positive electrode and the power supply lead portion to be connected to the positive electrode is disposed on the substrate 100'. Resist which is the same as that in the example 2 is applied by screen printing and then is cured. Thereafter, the ITO portion not covered with the resist is etched with acid, and then the resist is dissolved.

The substrate thus processed is rinsed with neutral soap and organic solvent, and the surface is cleaned with ultraviolet rays and ozone ($O_3$).

Figure 22A:
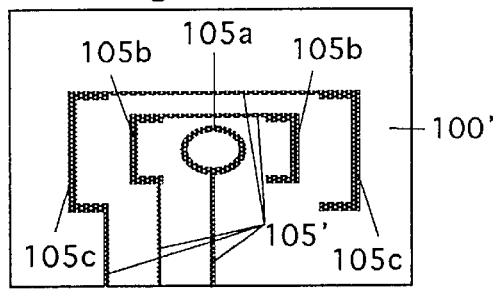
FIGS. 22(A) to 22(I) show steps of manufacturing further different examples of an organic electro-luminescence element.

Through the above steps, the positive electrode 105a, positive electrodes 105b on the left and right sides thereof and positive electrodes 105c on the left and right sides of the electrodes 105b as well as the lead portion 105' are formed as shown in FIG. 22(A).

Then, the substrate is move to a vacuum vapor deposition device, and a metal mask provided with a square opening of an area covering the whole positive electrodes is set on the positive electrodes. Then, 4,4',4"-tris[N,N',N"-triphenyl-N,N',N"-tris(3-methylphenyl)]triaminotriphenylamine is vapor-deposited as the hole injection layer so that a thin film S6 of a thickness of 10 nm is formed as shown in FIG. 22(B).

Then, a metal mask provided with a square opening of an area covering the positive electrode 105a is set, and N,N'-diphenyl-N,N'-bis(4-methylphenyl)-1,1'-bis(3-methylphenyl)-4,4'-diamine doped with 5 wt % of fluorescent dye DCM2 expressed by the following formula 1 is vapor-deposited as the luminescent layer on the hole injection layer S6. Thereby, a thin film S7 of 45 nm in thickness having a pattern shown in FIG. 22(C) is formed.

FORMULA 1

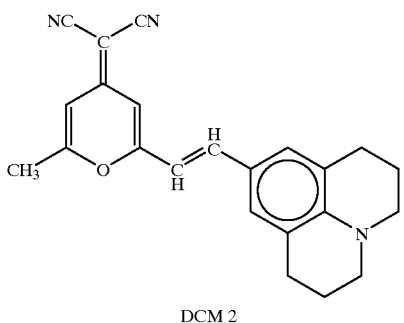

DCM 2

Figure 22F:
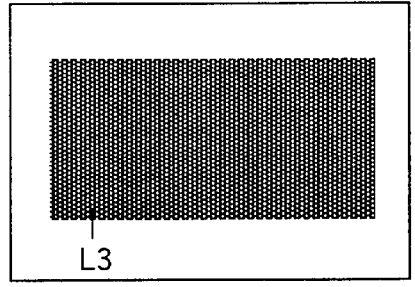
Figure 22B:
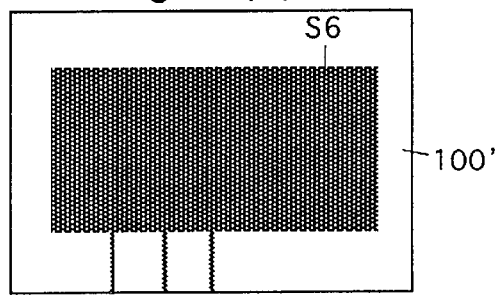
Figure 22G:
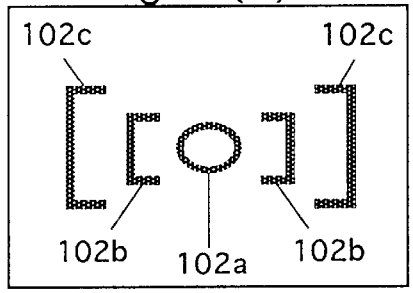
Figure 22C:
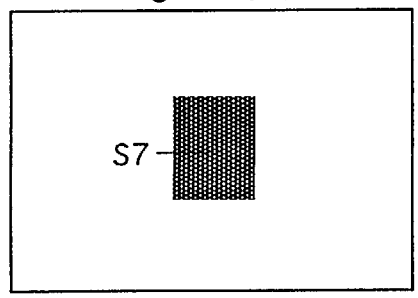
Figure 22H:
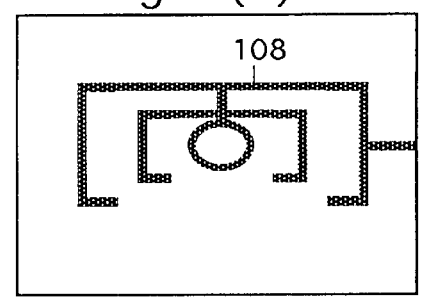
Figure 22D:
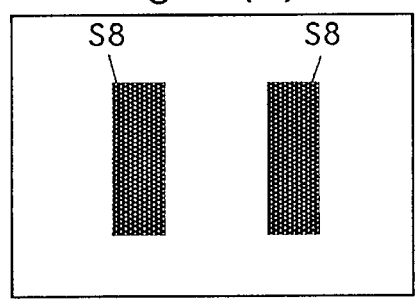

Then, a metal mask provided with a square opening of an area covering the positive electrodes 105b is set, and aluminum trisoxine doped with 1 wt % of N,N'-dimethylquinacridone is vapor-deposited as an organic luminescent layer so that a thin film S8 having a thickness of 20 nm and a pattern shown in FIG. 22(D) is formed.

Figure 22I:
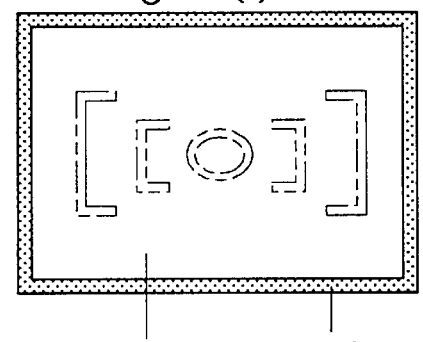
Figure 22E:
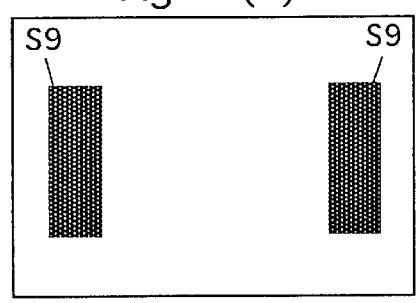

Further, a metal mask provided with a square opening of an area covering the positive electrodes 105c is set, and aluminum trisoxine doped with 3 wt % of rubrene is vapor-deposited as an organic luminescent layer so that a thin film S9 having a thickness of 20 nm and a pattern shown in FIG. 22(E) is formed.

Then, a metal mask provided with a square opening is set, and aluminum trisoxine is vapor-deposited over the organic luminescent layers S7, S8 and S9 as the electron transport layer so that a thin film of 60 nm in thickness is formed. Further, potassium acetylacetonate complex for forming the electron injection layer is deposited onto the above structure by resistance heating vapor deposition to form a thin film of 2 nm in thickness.

In this manner, a film L3 having the pattern shown in FIG. 22(F) and including the electron transport layer and the electron injection layer layered together is formed.

Thereafter, a metal mask having a cut pattern for the negative electrode corresponding to the configuration of the positive electrode is set, and sputtering of Ag—Mg alloy (Mg: 5 at %) is performed by a sputtering device so that the negative electrodes 102a, 102b and 102c of 50 Å in thickness having a pattern shown in FIG. 22(G) are formed.

Subsequently, a metal mask having a cut pattern corresponding to the power supply lead portion for the negative electrode is set, and sputtering of $In_2O_3$ doped with 5% of ZnO is performed by an RF sputtering device so that a thin film 108 of 180 nm in thickness having a pattern shown in FIG. 22(H) is formed.

Above it, glass substrate 104 having an end portion coated with epoxy resin 104b for sealing is placed as shown in FIG. 22(I), and the resin is thermally cured to provide sealing.

In this manner, the organic electro-luminescence element in which the display portion is entirely transparent is manufactured.

By applying a voltage of 10 V or more to this element, the macro AF area frame emits orange light, the standard AF area frame emits green light, and the parallax correction mark portion emits yellow light.

Example 4 of Manufacturing of Organic Electro-Luminescence Element

Figure 23A:
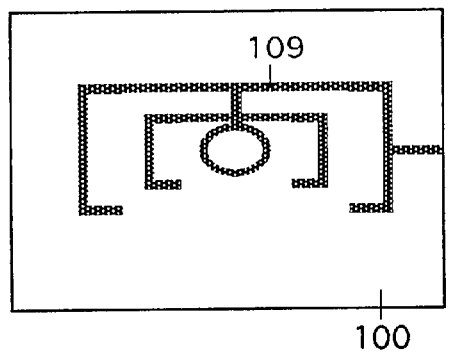
FIGS. 23(A) to 23(H) show steps of manufacturing further different examples of an organic electro-luminescence element.

A metal mask is set on the glass substrate 100. This metal mask has a cut pattern corresponding to the positive electrode and the power supply lead portion to be connected thereto. Sputtering of an ITO sintered target (containing $In_2O_3$ and 10 wt % of $SnO_2$) is performed by a sputtering device so that an electrically conductive ITO film 109 having a thickness of 50 nm and a pattern shown in FIG. 23(A) is formed.

Then, a metal mask provided with a square opening having an area covering the whole ITO film is set on the ITO film, and a vacuum vapor deposition device is used to deposit indanthrone forming the hole injection layer by the vacuum deposition so that a thin film of 10 nm in thickness is formed. Further, with the same mask, N,N'-diphenyl-N,N'-bis(1-naphthyl)-1,1'-diphenyl-4,4'-diamine is vapor-deposited to form the hole transport layer so that a thin film of 50 nm in thickness is formed.

Figure 23B:
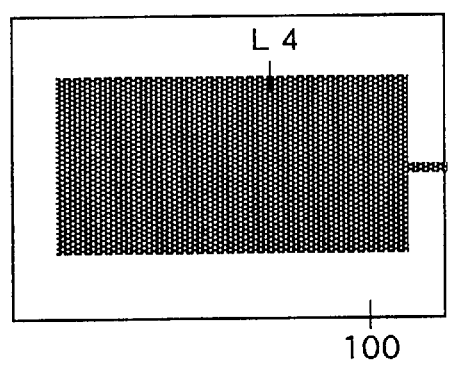

In this manner, a film L4 having the hole injection layer and the hole transport layer layered together is formed as shown in FIG. 23(B).

Figure 23C:
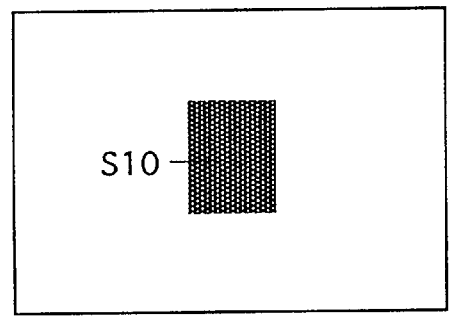

A metal mask provided with a square opening having an area covering the ITO film portion corresponding to the positive electrode 101a shown in FIG. 20(A) is set, and aluminum trisoxine which is doped with 1 wt % of fluorescent dye DCM1 expressed by the following formula 2 is vapor-deposited as the organic luminescent layer through the metal mask. Thereby, a thin film S10 having a pattern shown in FIG. 23(C) and a thickness of 20 nm is formed.

FORMULA 2

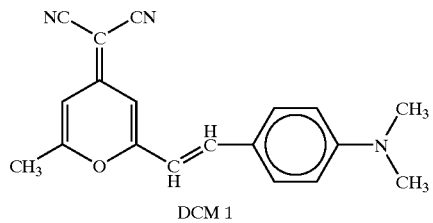

DCM 1

Figure 23D:
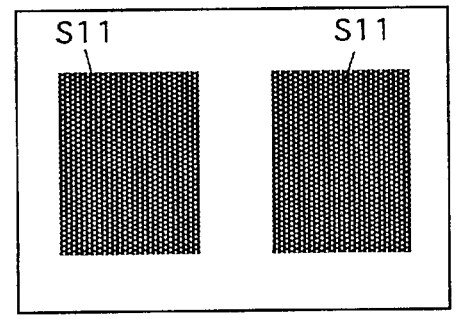

Then, a metal mask provided with square openings each having an area covering the ITO film portion corresponding to he positive electrodes 101b and 101c shown in FIG. 20(A) is set, and aluminum trisoxine which is doped with 1 wt % of N,N'-dimethylquinacridone is vapor-deposited as the organic luminescent layer through the metal mask. Thereby, a thin film S11 having a pattern shown in FIG. 23(D) and a thickness of 20 nm is formed.

Figure 23E:
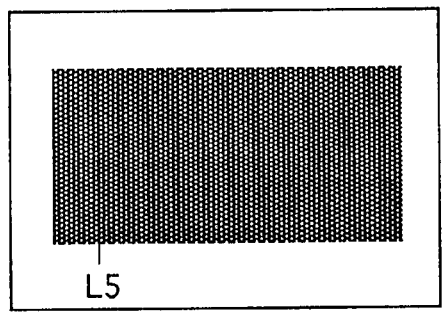

Then, a metal mask provided with a square opening of an area covering the almost whole ITO film 109 is set, and aluminum trisoxine is vapor-deposited as the electron transport layer so that a thin film of 50 nm in thickness is formed. Further, with the same mask, lithium salicylate is deposited as the electron injection layer by resistance heating vapor deposition to form a thin film of 2 nm in thickness. In this manner, a film L5 having the pattern shown in FIG. 23(E) and including the electron transport layer and the electron injection layer layered together is formed.

Figure 23F:
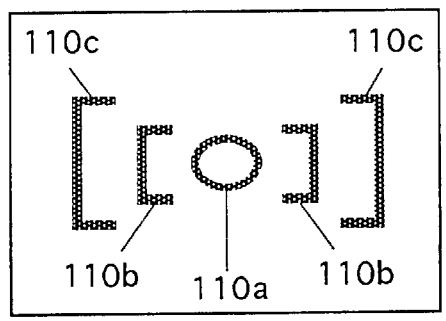

Thereafter, a metal mask having a cut pattern for the negative electrode corresponding to the ITO film 109 is set, and magnesium and silver in an atomic ratio of 10:1 are vapor-deposited to form a film of a thickness of 80 nm so that negative electrodes 110a, 110b and 110c of the pattern shown in FIG. 23(F) are formed.

Figure 23G:
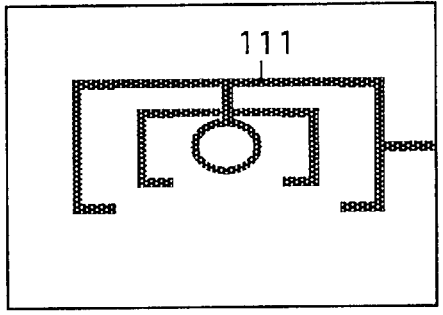

Above it, a metal mask having a cut pattern corresponding to the power supply lead portion for the negative electrode is set, and sputtering of an ITO sintered target is performed by a sputtering device so that a lead portion 111 of 100 nm in thickness having a pattern shown in FIG. 23(G) is formed.

Figure 23H:
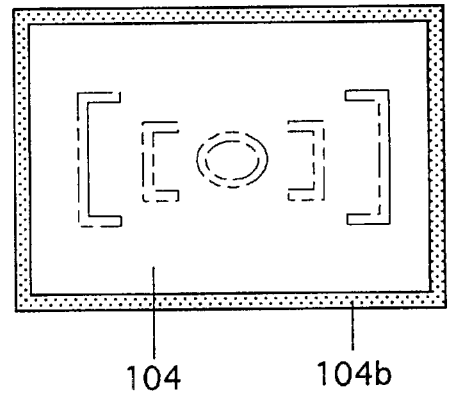

As shown in FIG. 23(H), the glass substrate 104 having an end or edge portion coated with epoxy resin 104b for sealing is placed, and the resin is thermally cured to provide sealing.

In this manner, the organic electro-luminescence element in which only the electrodes of the display portion are opaque is manufactured.

By applying a voltage of 10 V or more to this element, the AF area frame emits green light, and the parallax correction mark portion emits yellow light.

Example 5 of Manufacturing of Organic Electro-Luminescence Element

The substrate 100' which is a commercially available ITO-coated glass, in which ITO is about 150 nm in thickness, is prepared. A mask for screen printing which bears a pattern for the positive electrode and the power supply lead portion to be connected to the positive electrode is disposed on the substrate 100'. Resist which is the same as that in the example 2 is applied by screen printing and then is cured. Thereafter, the ITO portion not covered with the resist is etched with acid, and then the resist is dissolved.

The substrate thus processed is rinsed with neutral soap and organic solvent, and the surface is cleaned with ultraviolet rays and ozone ($O_3$)

Figure 24A:
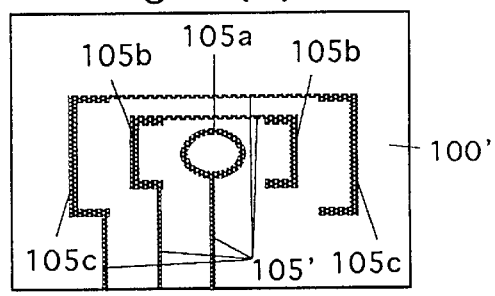
FIGS. 24(A) to 24(I) show steps of manufacturing further different examples of an organic electro-luminescence element.

Through the above steps, the positive electrode 105a, positive electrodes 105b on the left and right sides thereof and positive electrodes 105c on the left and right sides of the electrodes 105b as well as the lead portion 105' are formed as shown in FIG. 24(A).

Figure 24B:
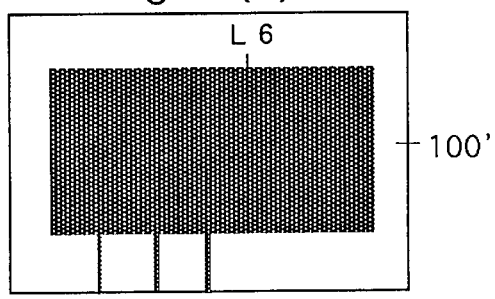

Then, the substrate is move to a vapor deposition device, and a metal mask provided with a square opening of an area covering the whole positive electrode is set on the positive electrode. Then, copper-phthalocyanine is vapor-deposited to form a thin film of 10 nm in thickness as the hole injection layer, and vapor deposition of N,N'-diphenyl-N,N'-bis(1-naphthyl)-1,1'-diphenyl-4,4'-diamine with the same mask is performed to form a thin film of 50 nm in thickness as the hole transport layer. In this manner, a layered film L6 including the hole injection layer and the hole transport layer layered together is formed as shown in FIG. 24(B).

Figure 24C:
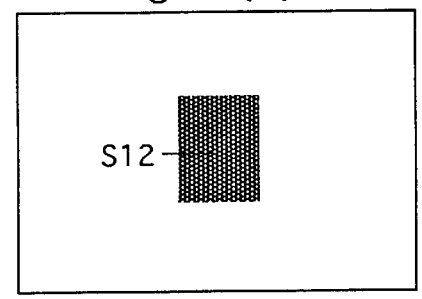

Then, a metal mask provided with a square opening having an area covering the positive electrode 105a is set, and aluminum trisoxine which is doped with 1 wt % of fluorescent dye DCM3 expressed by the following formula 3 is vapor-deposited on the film L6 to form the organic luminescent layer. Thereby, a thin film S12 having a pattern shown in FIG. 24(C) and a thickness of 20 nm is formed.

FORMULA 3

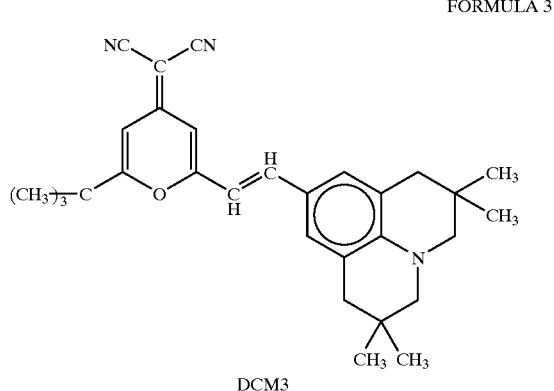

DCM3

Figure 24D:
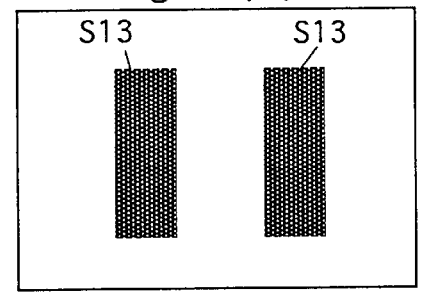

Then, a metal mask provided with a square opening having an area covering the positive electrodes 105b is set, and aluminum trisoxine which is doped with 1 wt % of N,N'-dimethylquinacridone is vapor-deposited as the organic luminescent layer. Thereby, a thin film S13 having a pattern shown in FIG. 24(D) and a thickness of 20 nm is formed.

Figure 24E:
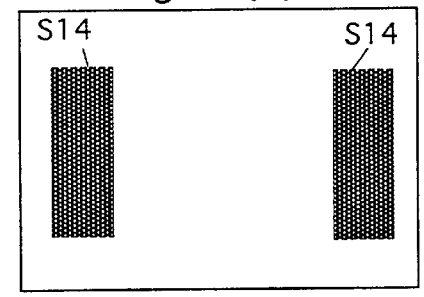

Further, a metal mask provided with a square opening having an area covering the positive electrodes 105c is set, and aluminum trisoxine which is doped with 3 wt % of rubrene is vapor-deposited as the organic luminescent layer. Thereby, a thin film S14 having a pattern shown in FIG. 24(E) and a thickness of 20 nm is formed.

Figure 24F:
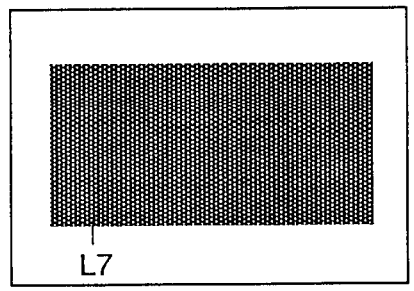

Then, a metal mask provided with a square opening is set, and aluminum trisoxine is vapor-deposited over the organic luminescent layers S12, S13 and S14 as the electron transport layer so that a thin film of 60 nm in thickness is formed. Further, lithium acetylacetonate complex for forming the electron injection layer is deposited onto the above structure by resistance heating vapor deposition to form a thin film of 3 nm in thickness. In this manner, a film L7 having the pattern shown in FIG. 24(F) and including the electron transport layer and the electron injection layer layered together is formed.

Figure 24G:
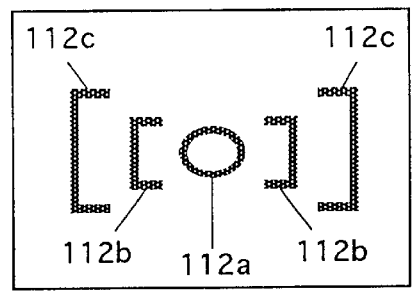

Thereafter, a metal mask having a cut pattern for the negative electrode corresponding to the configuration of the positive electrode is set, and sputtering of Al—Li alloy (Li: 1 wt %) is performed by a sputtering device so that negative electrodes 112a, 112b and 112c having a pattern shown in FIG. 24(G) are formed.

Figure 24H:
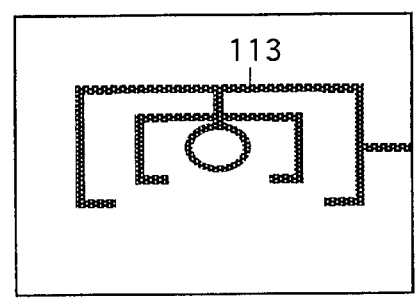

Subsequently, a metal mask having a cut pattern corresponding to the power supply lead portion for the negative electrode is set, and sputtering of $In_2O_3$ doped with 5% of ZnO is performed by an RF sputtering device so that a thin film 113 of 180 nm in thickness having a pattern shown in FIG. 24(H) is formed.

Figure 24I:
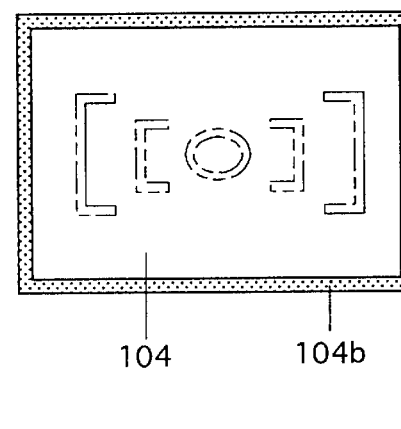

Above it, glass substrate 104 having an end portion coated with epoxy resin 104b for sealing is placed as shown in FIG. 24(I), and the resin is thermally cured to provide sealing.

In this manner, the organic electro-luminescence element in which the electrodes only in the display portion are opaque is manufactured.

By applying a voltage of 10 V or more to this element, the macro AF area frame emits yellow light, the standard AF area frame emits green light, and the parallax correction mark portion emits red light.

Example 6 of Manufacturing of Organic Electroluminescence Element

A metal mask is set on the transparent glass substrate 100. This metal mask has a cut pattern corresponding to the positive electrode and the power supply lead portion to be connected thereto. Sputtering of an ITO sintered target (containing $In_2O_3$ and 10 wt % of $SnO_2$) is performed by a sputtering device so that an electrically conductive ITO film having a thickness of 50 nm is formed through the metal mask. Thereby, the positive electrode 101a, positive electrodes 101b on the left and right sides thereof and positive electrodes 101c on the left and right sides of the electrodes 101b as well as the lead portion 101' are formed.

Then, the substrate is moved to a vacuum vapor deposition device, and a metal mask provided with a square opening having an area covering the whole positive electrodes is placed on the ITO film. As the electric charge transport layer, N,N'-diphenyl-N,N'-bis(1-naphthyl)-1,1'-diphenyl-4,4'-diamine is deposited by the vacuum deposition method to form a thin film of 30 nm in thickness.

With the same metal mask, aluminum trisoxine which is doped with 1 mole % of DCM1 is vapor-deposited as the first luminescent layer through the metal mask. Thereby, a thin film having a thickness of 20 nm is formed.

Using the same mask, aluminum trisoxine for a host luminescent layer is vapor-deposited on the above structure to form a thin film of 20 nm in thickness.

Using the same mask, aluminum trisoxine which is doped with 1 mole % of fluorescent dye C540 expressed by the following formula 4 is vapor-deposited on the above structure to form a thin film of 20 nm in thickness as a second luminescent layer.

FORMULA 4

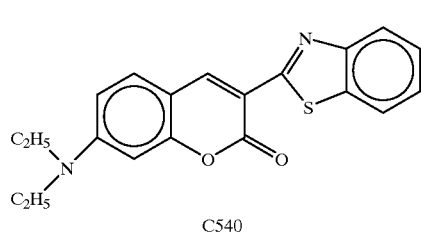

C540

Using the same mask, N,N'-diphenyl-N,N'-bis(1-naphthyl)-1,1'-diphenyl-4,4'-diamine is vapor-deposited on the above structure to form a thin film of 30 nm in thickness as the electric charge transport layer.

Figure 25A:
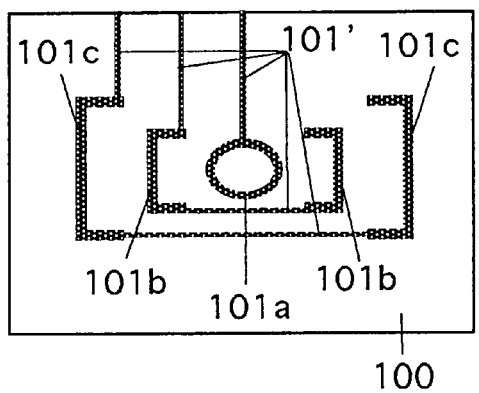
FIGS. 25(A) to 25(D) show steps of manufacturing further different examples of an organic electro-luminescence element.
Figure 25D:
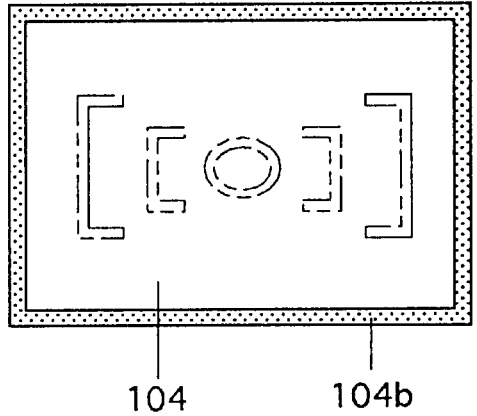
Figure 25B:
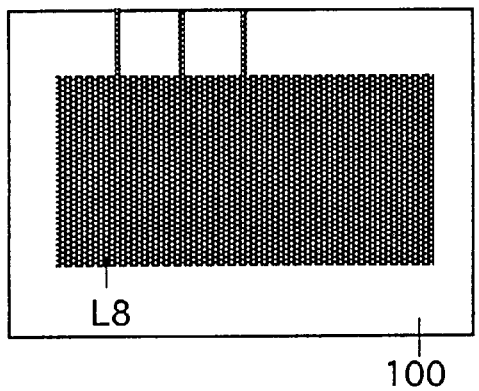

In this manner, a film L8 which includes the charge transport layer, first luminescent layer, host luminescent layer, second luminescent layer and charge transport layer in a layered fashion as shown in FIG. 25(B) is formed.

Figure 25C:
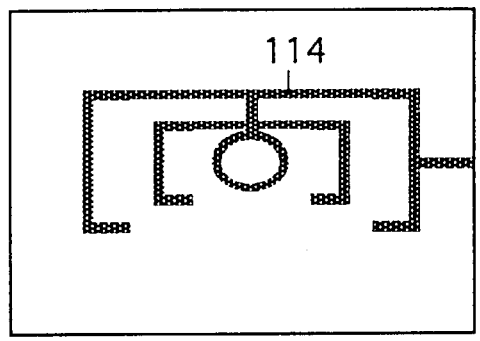

Finally, a metal mask having a cut pattern corresponding to the negative electrode and the lead portion thereof is placed, and ITO is sputtered by a sputtering device so that a negative electrode thin film 114 having a pattern shown in FIG. 25(C) and a thickness of 100 nm is formed.

As shown in FIG. 25(D), the glass substrate having an end or edge portion coated with epoxy resin 104b for sealing is placed, and the resin is thermally cured to provide sealing.

In this manner, the organic electro-luminescence element in which the whole display portion is transparent is manufactured.

This element emits orange light when a voltage of 25 V is applied thereto, and emits green light when a voltage of −25 V is applied.

Accordingly, the light in different colors can be emitted from the same portion of each mark by changing the voltage applied thereto.

Example 7 of Manufacturing of Organic Electro-Luminescence Element

The substrate 100' which is a commercially available ITO-coated glass, in which ITO is about 150 nm in thickness, is prepared. A mask for screen printing which bears a pattern for the positive electrode and the power supply lead portion to be connected to the positive electrode is disposed on the substrate 100'. Resist which is the same as that in the example 2 is applied by screen printing and then is cured. Thereafter, the ITO portion not covered with the resist is etched with acid, and then the resist is dissolved.

The substrate thus processed is rinsed with neutral soap and organic solvent, and the surface is cleaned with ultraviolet rays and ozone ($O_3$).

Figure 26A:
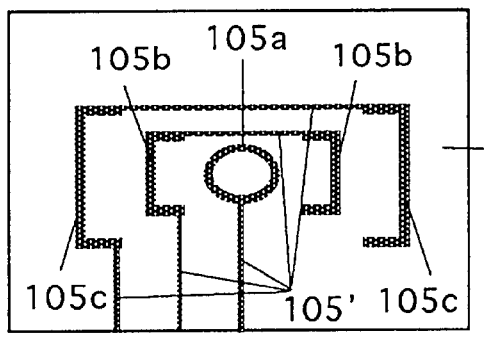
FIGS. 26(A) to 26(G) show steps of manufacturing further different examples of an organic electro-luminescence element.

Through the above steps, the positive electrode 105a, positive electrodes 105b on the left and right sides thereof and positive electrodes 105c on the left and right sides of the electrodes 105b as well as the lead portion 105' are formed as shown in FIG. 26(A).

Figure 26E:
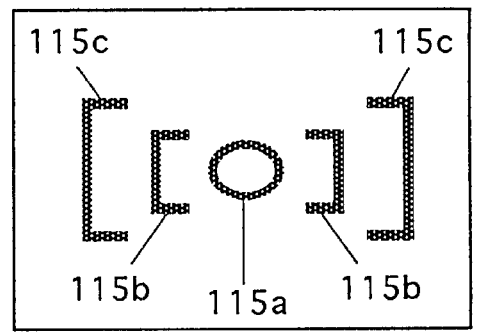
Figure 26B:
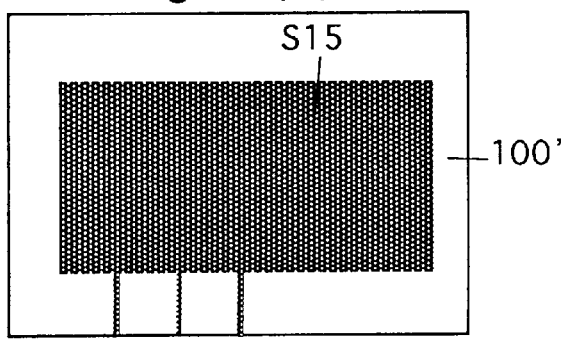

A metal mask having a square opening of an area covering the whole positive electrodes is set, and poly (2,5-dinonyloxy-p-pherylenebinylene) is applied by spin coating to form a thin film S15 of a thickness of 30 nm as the first luminescent layer as shown in FIG. 26(B).

Figure 26F:
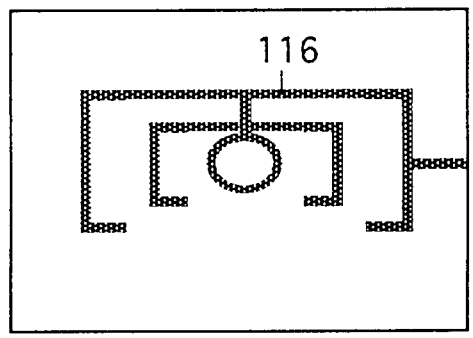
Figure 26C:
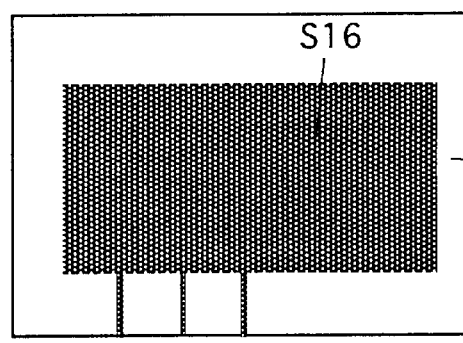
Figure 26G:
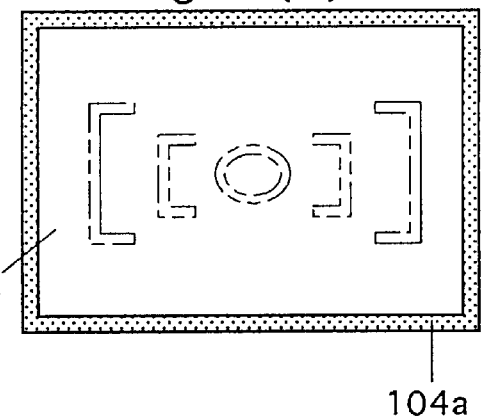

A metal mask having a square opening of an area covering the whole positive electrodes is set on the above structure, and N,N'-diphenyl-N,N'-bis(1-naphthyl)-1,1'-diphenyl-4,4'-diamine is vapor-deposited to form a thin film S16 of 30 nm in thickness as a blocking layer, as shown in FIG. 26(C).

Figure 26D:
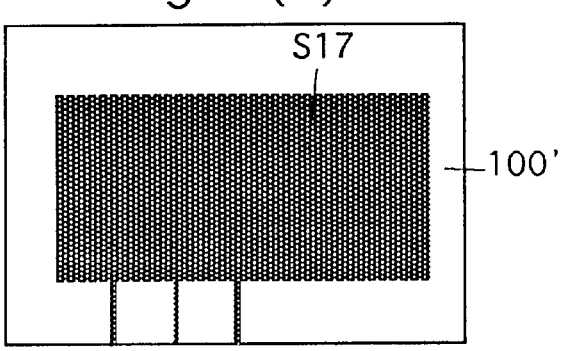

With the same mask, a compound DPVB' expressed by the following formula 5 is deposited by vacuum vapor deposition as a second luminescent layer so that a thin film S17 of 30 nm in thickness is formed as shown in FIG. 26(D).

FORMULA 5

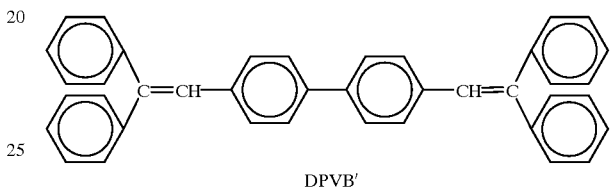

DPVB'

Thereafter, a metal mask having a cut pattern for the negative electrode is set, and aluminum is vapor-deposited through the mask to form a thin film of a thickness of 200 nm so that negative electrodes 115a, 115b and 115c having a pattern shown in FIG. 26(E) are formed.

Thereafter, a metal mask having a cut pattern corresponding to the power supply lead portion for the negative electrode is set, and $In_2O_3$ doped with 5% of ZnO is sputtered by a helicon sputtering device through the mask so that a thin film 116 of 180 nm in thickness is formed as shown in FIG. 26(F).

Finally, the transparent glass substrate 104 having an end or edge portion coated with acrylic resin 104a for sealing is laid, and the resin is cured by irradiation with ultraviolet rays for sealing.

In this manner, the organic electro-luminescence element in which only the electrodes in the luminescent portion are opaque is manufactured.

By applying a voltage of 20 V to this element, red light is emitted. When a voltage of −20 V is applied, blue light is emitted.

Accordingly, the light in different colors can be emitted from the same portion of each mark by changing the voltage applied thereto.

Example 8 of Manufacturing of Organic Electro-Luminescence Element

The substrate 100' which is a commercially available ITO-coated glass, in which ITO is about 150 nm in thickness, is prepared. A mask for screen printing which bears a pattern for the positive electrode and the power supply lead portion to be connected to the positive electrode is disposed on the substrate 100'. Resist which is the same as that in the example 2 is applied by screen printing and then is cured. Thereafter, the ITO portion not covered with the resist is etched with acid, and then the resist is dissolved.

The substrate thus processed is rinsed with neutral soap and organic solvent, and the surface is cleaned with ultraviolet rays and ozone ($O_3$).

Through the above steps, the positive electrodes 105a, 105b and 105c as well as the lead portion 105' are formed as shown in FIG. 27(A).

A metal mask having a square opening of an area covering the whole positive electrodes is set, and perylene pigment expressed by the following formula 6 is deposited as the first luminescent layer by vapor deposition so that a thin film of 20 nm in thickness is formed.

FORMULA 6

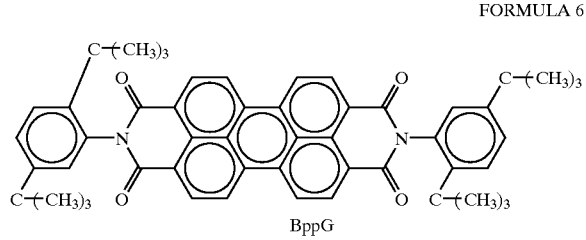

BppG

With the same mask, N,N'-diphenyl-N,N'-bis(1-naphthyl)-1,1'-diphenyl-4,4'-diamine is vapor-deposited as a blocking layer so that a thin film of 30 nm in thickness is formed.

With the same mask, pentaphenylcyclopentadiene is deposited by vacuum vapor deposition as a second luminescent layer so that a thin film of 20 nm in thickness is formed.

Then, with the same mask, aluminium trisoxine is vapor-deposited on the above structure by vacuum deposition so that a thin film of 5 nm in thickness is formed as the electron injection layer.

In this manner, a layer structure L9 of these thin films is formed on the positive electrodes.

Thereafter, a metal mask having a cut pattern corresponding to the positive electrode is set, and aluminum is vapor-deposited through the mask to form a thin film of a thickness of 50 Å so that electrodes 117a, 117b and 117c having a pattern shown in FIG. 27(C) is formed.

Thereafter, a metal mask having a cut pattern corresponding to the power supply lead portion for the electrode is set, and $In_2O_3$ doped with 5% of ZnO is sputtered by a helicon sputtering device through the mask so that a thin film 118 of 180 nm in thickness is formed as shown in FIG. 27(D).

With a metal mask having a square opening, N,N'-diphenyl-N,N'-bis(1-naphthyl)-1,1'-diphenyl-4,4'-diamine is vapor-deposited to form a thin film of 40 nm in thickness as the hole transport layer. Further, with the same mask, aluminum trisoxine is deposited by vacuum vapor deposition on the above structure to form a thin film of 40 nm in thickness as a third luminescent layer. Thereby, a layer structure L10 including these thin films and having a pattern shown in FIG. 27(E) is formed.

Further, a metal mask having a cut pattern for the negative electrode is set, and Al—Li alloy (Li: 1 wt %) is deposited on the above structure by a vapor deposition device so that the negative electrodes 118a, 118b and 118c having a pattern shown in FIG. 27(F) are formed.

Thereafter, a mask having a pattern corresponding to the power supply lead portion for the negative electrode is set, and $In_2O_3$ doped with 5% of ZnO is sputtered by a helicon sputtering device through the mask so that a thin film 119 of 180 nm in thickness is formed as shown in FIG. 27(G).

Then, the transparent glass substrate 104 having an end or edge portion coated with acrylic resin 104a for sealing is laid on the above structure, and the resin is cured by irradiation with ultraviolet rays for sealing.

In this manner, the organic electro-luminescence element in which only the electrodes in the luminescent portion are opaque is manufactured.

In this element, when a voltage of 25 V is applied across the ITO electrodes 105a–105c serving as the positive electrode and the semitransparent aluminum electrodes 117a–177c, red light is emitted. When a voltage of –25 V is applied, blue light is emitted.

When a voltage of 20 V is applied across the semitransparent aluminum electrodes 117a–117c serving as the positive electrode and the Al—Li electrodes 118a–118c, green light is emitted.

Accordingly, the light in three colors can be selectively emitted from the different portions of each mark, and can also be selectively emitted from the same portion of each mark by applying the voltage in different manners so that color displaying can be also performed.

Example 9 of Manufacturing of Organic Electro-luminescence Element

Figure 28A:
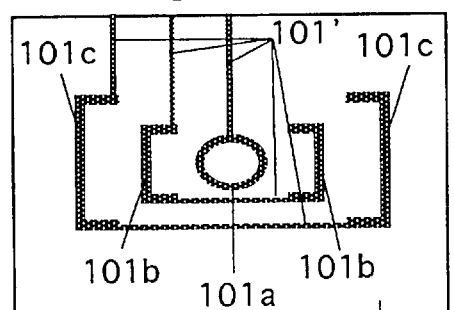
FIGS. 28(A) to 28(D) show steps of manufacturing further different examples of an organic electro-luminescence element.

A metal mask is set on the transparent glass substrate 100. This metal mask has a cut pattern for the positive electrode and the power supply lead portion to be connected thereto. Sputtering of an ITO sintered target (containing $In_2O_3$ and 10 wt % of $SnO_2$) is performed by a sputtering device so that an electrically conductive ITO film having a thickness of 50 nm is formed through the metal mask. Thereby, the positive electrode 101a, positive electrodes 101b on the left and right sides thereof and positive electrodes 101c on the left and right sides of the electrodes 101b as well as the lead portion 101' are formed as shown in FIG. 28(A).

Then, the substrate is moved to a vacuum vapor deposition device, and a metal mask provided with a square opening having an area covering the whole positive electrodes is set thereon. As the hole transport layer also serving as the luminescent layer, N,N'-diphenyl-N,N'-bis(1-naphthyl)-1,1'-diphenyl-4,4'-diamine is deposited by the vacuum vapor deposition method to form a thin film of 40 nm in thickness.

With the same mask, a triazole compound expressed by the following formula 7 is deposited by vapor deposition as an electron transport layer so that a thin film of 30 Å in thickness is formed.

FORMULA 7

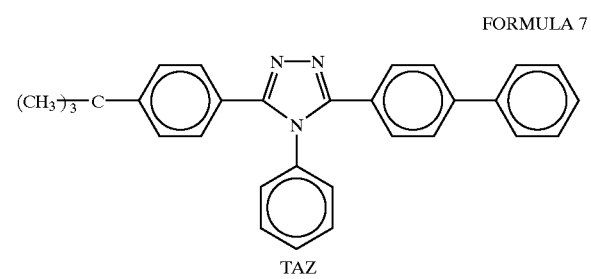

TAZ

With the same mask, aluminum trisoxine is vapor-deposited as an organic luminescent layer so that a thin film of 50 nm in thickness is formed.

With the same mask, potassium benzoate is then vapor-deposited as an electron injection layer so that a thin film of 1 nm in thickness is formed.

Figure 28B:
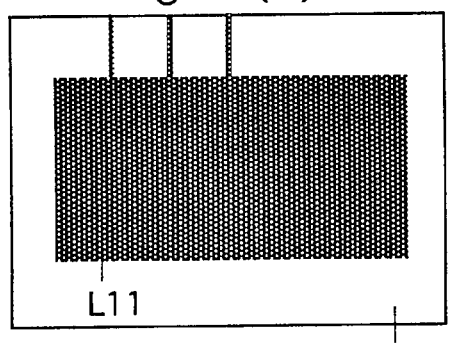

In this manner, a layer structure L11 formed of the hole transport layer also serving as the luminescent layer as well as the electron transport layer, the organic luminescent layer and the electron injection layer is formed as shown in FIG. 28(B).

Figure 28C:
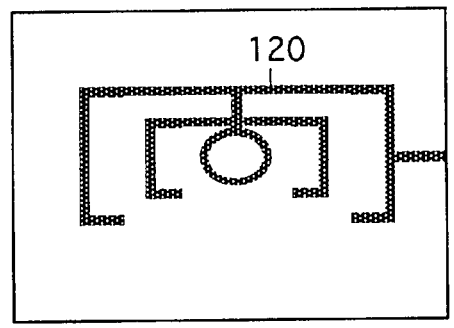

Then, a mask having a cut pattern corresponding to the negative electrode and the power supply lead portion is set, and sputtering of ITO is performed by a sputtering device so that a thin film 120 of 200 nm in thickness, which has a pattern shown in FIG. 28(C), is formed.

Figure 28D:
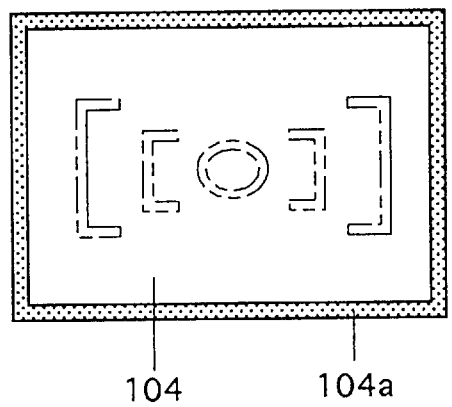

Finally, as shown in FIG. 28(D), the glass substrate 104 having an end portion coated with acrylic resin 104*a* for sealing is laid on the above structure, and the resin is cured by irradiation with ultraviolet rays for sealing.

In this manner, the organic electro-luminescence element in which the whole luminescent portion is transparent is manufactured.

When a low voltage is applied to this element, it emits blue light. As the voltage applied thereto is gradually increased, the color of the light changes from blue green to the green.

By changing the applied voltage, therefore, the color of the emitted light can be changed not only in the different portions of each mark but also in the same portion.

As described above, the information representing the shooting conditions in the finder of the camera is displayed in a fashion superimposed on the-shooting image viewed through the finder at the finder screen, depending on the shooting conditions. Therefore, the user can reliably obtain the information required for shooting, while continuously viewing the finder screen. Compared with the case where a conventional liquid crystal display or a conventional projection light source is employed, the information can be recognized more easily and the transparency is high so that the visibility of the image viewed through the finder can be high.

In the camera provided with the finder optical system, which includes the object optical system, the reverse optical system having a prism, and the eye-piece optical system, as well as the independent shooting optical system, the position of the shooting range at the finder screen is displayed when the short-distance shooting causing a large shift of the shooting range with respect to the finder screen is selected, and thus when the parallax correction is required. In this case, therefore, the user can reliably recognize the fact that the parallax correction is required, and can also recognize the position of the shooting scope at the finder screen.

The organic electro-luminescence element may be controlled to be turned off in the case other than the above, whereby the organic electro-luminescence element is transparent, and thereby the organic electro-luminescence element does not obstruct the view when the parallax correction is not required. When the organic electro-luminescence element is performing the display for parallax correction, the parallax correction can be performed only by adjusting the displayed position of the shooting scope to turn off the AF area frame.

For example, by selecting the macro shooting mode for the proximity shooting, when the shift of the shooting scope at the finder screen increases to an extent requiring the parallax correction, the element may be configured to display the position of the shooting scope at the finder screen. Thereby, in the above case, the user can reliably recognize that the macro shooting mode is set and the parallax correction is required, and can also reliably recognize the position of the shooting scope at the finder screen. In this case, further, the parallax correction can be performed only by adjusting the displayed position of the shooting scope to the predetermined position which turns off the AF area frame.

Control may also be performed to turn off the organic electro-luminescence element when the macro shooting mode is not selected, whereby the organic electroluminescence element, not displaying information, does not obstruct the view when the macro shooting;mode is not selected. Thus, obstruction is not present in contrast to the case where the parallax correction mark is always displayed near the center of the finder screen.

Since an appropriate shooting scope can be displayed, the user can easily perform the shooting.

In addition to the above, various kinds of warning and attention relating to errors and others can be displayed for the user. Further, the element can provide the means of a high visibility owing to the self luminescent type.

As already described, the organic EL element (organic EL display element) according to the invention can be applied not only to the optical devices such as a camera provided with the finder but also to various devices other than the above. Description will now be given on other examples of application of the organic EL element according to the invention.

Figure 32:
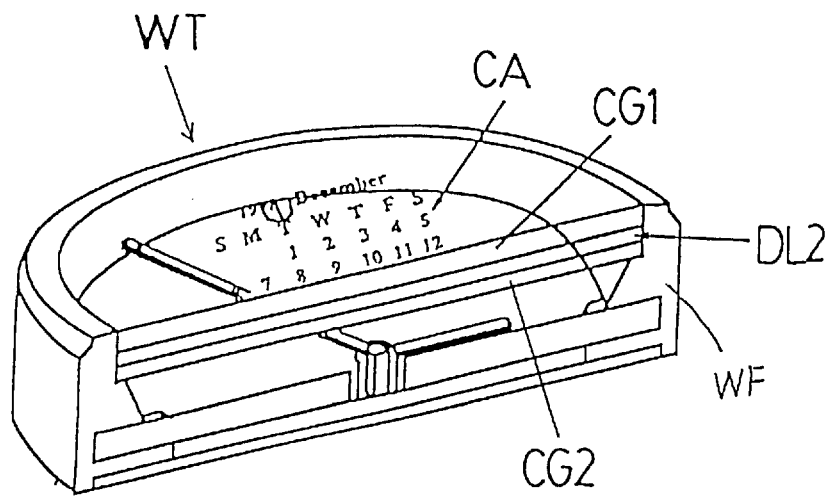
FIG. 32 is a perspective view showing an example of a portion of a clock having a glass cover which is internally provided with an organic electro-luminescence element according to the invention.

FIG. 32 shows an example, in which the organic electro-luminescence display element according to the invention is arranged within a transparent surface cover glass of a watch. In the example shown in FIG. 32, a display element DL2 according to the invention is held between two transparent glass covers CG1 and CG2 located above a dial of a watch WT, and is arranged within a glass frame WF. Thereby, a calendar CA or the like is displayed by the display element DL2 between the cover glasses.

As described above, the organic electro-luminescence display element according to the invention may be arranged within the watch for displaying a date, a map and others. Also, the element can emit light during the night. The element may be used for displaying warning relating to change of a battery or the like.

Figure 33:
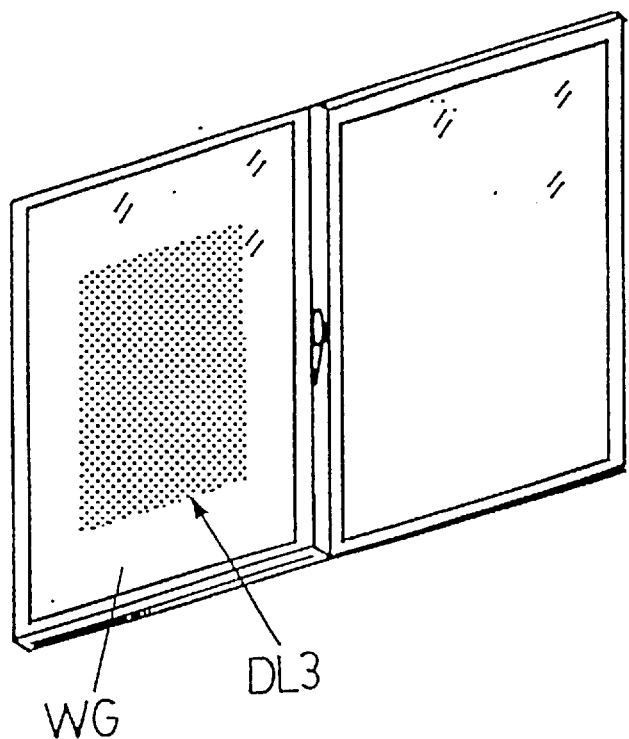
FIG. 33 is a perspective view of an example of a window pane internally provided with an organic electro-luminescence element according to the invention.

FIG. 33 shows an example in which the organic electro-luminescence display element according to the invention is arranged within or on a window pane. As shown in FIG. 33, a organic electro-luminescence: display element DL3 according to the invention is arranged over a window pane WG, e.g., for display of advertisements, illumination, lighting during the night or others.

Figure 34:
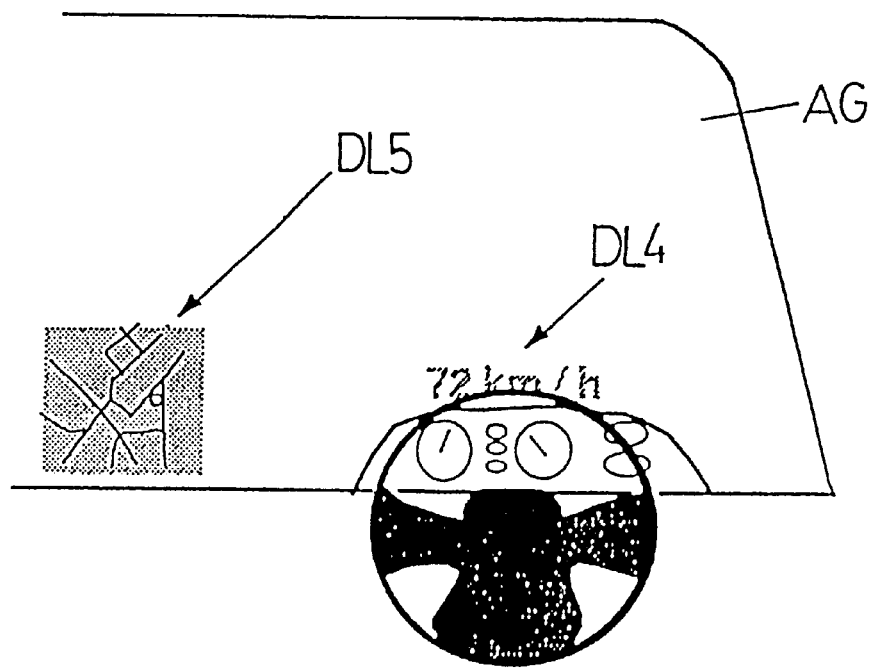
FIG. 34 shows an example of a portion of an automobile having a windshield which is internally provided with an organic electro-luminescence element according to the invention.

FIG. 34 shows an example, in which the organic electro-luminescence display element according to the invention is used in a head-up display for an automobile. As shown in FIG. 34, organic electro-luminescence display elements DL4 and DL5 according to the invention are arranged over a windshield AG of an automobile for displaying, e.g., a vehicle speed or for using the element as a display of a navigation device.

If the element is used as the head-up display in the automobile, the element which requires a low drive voltage does not apply a large load on a battery of the automobile, and can display contents in colors and/or in a manner effectively calling attention of a driver.

Since the organic electro-luminescence display element does not obstruct the view through the windshield, it does not obstruct the usual driving operation while allowing effective calling of attention owing to its luminous display.

Figure 35:
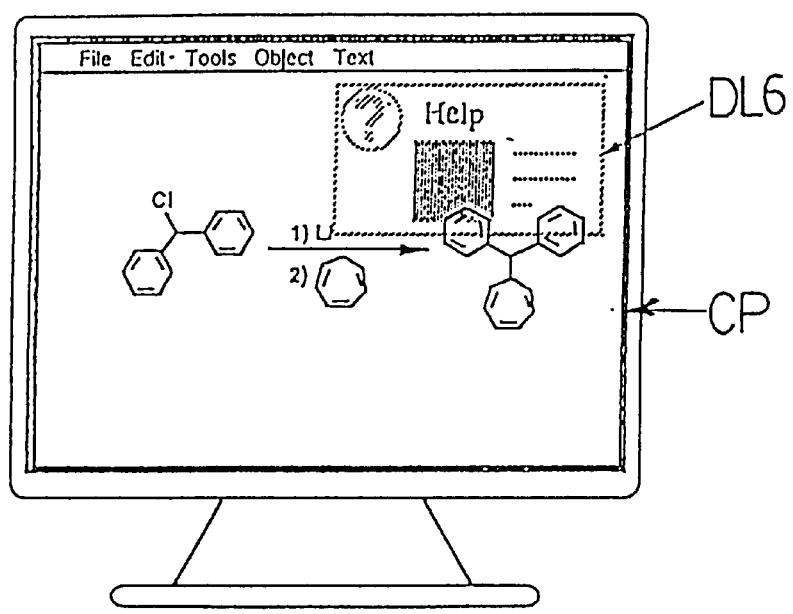
FIG. 35 shows an example of an organic electro-luminescence element according to the invention used as a overlay display on a computer display screen.

FIG. 35 shows an example, in which the organic electro-luminescence display element according to the invention is used in an overlay display. FIG. 35 shows an example, in which an display element DL6 according to the invention is arranged over a display screen CP of a computer.

By arranging the organic electro-luminescence display element according to the invention within a frame of an LCD panel or a CRT, the element which is of the luminescent type can provide good visibility of information in a superimposed fashion, and can effectively call an attention or the like.

The element may be used for displaying a channel or a time for user's convenience.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent display element comprising:
   a positive electrode, an organic luminescent film, an electron injection layer and a negative electrode;
   wherein each of said positive and negative electrodes, the organic luminescent film, and the electron injection layer is transparent so that a portion of said element has a visible light transmittance of 70% or more, and said electron injection layer is made of an organic metal salt containing an alkali metal or an alkaline earth metal as a metal, or an organic metal complex containing an alkali metal or an alkaline earth metal as a metal, said organic metal complex being at least a complex selected from the group consisting of acetylacetonate complexes, α-nitroso-β-naphthol complexes, salicylaldoxime complexes, cupferron complexes, benzoinoxime complexes, bipyridine complexes, phenanthroline complexes, crown complexes, proline complexes and benzoylacetone complexes.

2. The organic electroluminescent display element according to claim 1, wherein said negative electrode is formed of a thin metal film containing metal having work function of 4 eV or less.

3. The organic electroluminescent display element according to claim 1, wherein a thickness of a portion between said positive and negative electrode is in a range form 20 nm to 200 nm.

4. The organic electroluminescent display element according to claim 1, wherein a luminescent layer in said organic luminescent film is doped with fluorescent dye.

5. The organic electroluminescent display element according to claim 1, wherein said positive and negative electrodes are connected to a power source by corresponding leads so that the display element is driven as a matrix.

6. An organic electroluminescent display element according to claim 1, wherein the electron injection layer has a thickness of 0.1 to 20 nm.

7. An organic electroluminescent display element according to claim 1, further comprising an electron transporting layer which is disposed between the electron injection layer and the organic luminescent film and comprises a film made of a material different from a material of the electron injection layer.

8. An organic electroluminescent display element comprising:
   a positive electrode, an organic luminescent film, an electron injection layer and a negative electrode;
   wherein said negative electrode is a thin film made of a metal having a thickness of 1 to 10 nm and said electron injection layer is made of an organic metal salt containing an alkali metal or an alkaline earth metal as a metal, or an organic metal complex containing an alkali metal or an alkaline earth metal as a metal, said organic metal complex comprising at least one complex selected from the group consisting of acetylacetonate complexes, α-nitroso-β-naphthol complexes, salicylaldoxime complexes, cupferron complexes, benzoinoxime complexes, bipyridine complexes, phenanthroline complexes, crown complexes, proline complexes and benzoylacetone complexes.

9. The organic electroluminescent display element of claim 8, wherein the metal of the negative electrode is at least one metal selected from the group consisting of aluminum, indium, magnesium, calcium, titanium and manganese.

10. The organic electroluminescent display element of claim 9, further comprising a coating layer formed on the negative electrode, said coating layer having a thickness of 10 to 500 nm and comprising tin oxide, indium oxide, antimony oxide, zinc oxide, zirconium oxide or indium tin oxide.

11. An organic electroluminescent display element comprising:
    a positive electrode, an organic luminescent film, an electron injection layer and a negative electrode;
    wherein the electron injection layer and the negative electrode are configured so that the organic luminescent film emits light through the electron injection layer and the negative electrode, and
    wherein said electron injection layer is made of an organic metal salt containing an alkali metal or an alkaline earth metal as a metal, or an organic metal complex containing an alkali metal or an alkaline earth metal as a metal, said organic metal complex being at least a complex selected from the group consisting of acetylacetonate complexes, α-nitroso-β-naphthol complexes, salicylaldoxime complexes, cupferron complexes, benzoinoxime complexes, bipyridine complexes, phenanthroline complexes, crown complexes, proline complexes and benzoylacetone complexes.

12. The organic electroluminescent display element of claim 11, wherein said negative electrode is a thin film made of a metal having a thickness of 1 to 10 nm.

13. The organic electroluminescent display element of claim 12, wherein the metal of the negative electrode is at least one metal selected from the group consisting of aluminum, indium, magnesium, calcium, titanium and manganese.

* * * * *